(12) United States Patent
Wloczysiak

(10) Patent No.: US 10,965,021 B2
(45) Date of Patent: Mar. 30, 2021

(54) RADIO FREQUENCY SYSTEMS WITH TUNABLE FILTER

(71) Applicant: Skyworks Solutions, Inc., Irvine, CA (US)

(72) Inventor: Stephane Richard Marie Wloczysiak, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/277,249

(22) Filed: Feb. 15, 2019

(65) Prior Publication Data

US 2019/0273314 A1 Sep. 5, 2019

Related U.S. Application Data

(60) Provisional application No. 62/638,452, filed on Mar. 5, 2018, provisional application No. 62/690,042, filed on Jun. 26, 2018.

(51) Int. Cl.
| | |
|---|---|
| *H01Q 1/52* | (2006.01) |
| *H03H 7/01* | (2006.01) |
| *H04B 1/04* | (2006.01) |
| *H04B 1/18* | (2006.01) |

(52) U.S. Cl.
CPC .......... *H01Q 1/521* (2013.01); *H03H 7/0161* (2013.01); *H04B 1/0458* (2013.01); *H04B 1/18* (2013.01); *H04B 2001/045* (2013.01)

(58) Field of Classification Search
CPC .... H01Q 1/521; H03H 7/0161; H04B 1/0458; H04B 1/18; H04B 2001/045

USPC ....................................................... 455/73–84
See application file for complete search history.

(56) References Cited

U.S. PATENT DOCUMENTS

| | | | |
|---|---|---|---|
| 9,225,382 B2 | 12/2015 | Khlat | |
| 9,712,196 B2 | 7/2017 | Ripley et al. | |
| 9,712,197 B2 | 7/2017 | Ripley et al. | |
| 9,966,982 B2 | 5/2018 | Ripley et al. | |
| 10,103,772 B2 | 10/2018 | Pehlke et al. | |
| 2003/0232611 A1* | 12/2003 | Vasa | H04B 1/12 455/307 |
| 2012/0163245 A1 | 6/2012 | Tone et al. | |

(Continued)

OTHER PUBLICATIONS

International Search Report and Written Opinion Issued for International Application No. PCT/US2019/020041 dated Jun. 14, 2019 in 11 pages.

(Continued)

*Primary Examiner* — Lee Nguyen
(74) *Attorney, Agent, or Firm* — Knobbe, Martens, Olson & Bear, LLP

(57) ABSTRACT

Radio frequency (RF) systems with tunable filters are provided herein. In certain embodiments, an RF system includes a first RF processing circuit configured to process a first frequency band of a first communication standard and a second frequency band of a second communication standard. The first frequency band and the second frequency band are close in frequency and/or partially overlapping in frequency. The first RF processing circuit includes a tunable filter for changing the bandwidth of the first RF processing circuit to enhance the robustness of the first RF processing circuit to blocker or jammer signals of a third frequency band.

20 Claims, 30 Drawing Sheets

(56) References Cited

U.S. PATENT DOCUMENTS

| | | | |
|---|---|---|---|
| 2013/0244722 A1* | 9/2013 | Rousu | H04B 1/16 455/552.1 |
| 2013/0260707 A1 | 10/2013 | Li | |
| 2014/0194074 A1 | 7/2014 | Klomsdorf et al. | |
| 2014/0327561 A1 | 11/2014 | Wloczysiak | |
| 2015/0003306 A1 | 1/2015 | Domino et al. | |
| 2015/0172081 A1 | 6/2015 | Wloczysiak | |
| 2015/0214985 A1 | 7/2015 | Lee et al. | |
| 2015/0295596 A1 | 10/2015 | Wloczysiak et al. | |
| 2015/0295597 A1 | 10/2015 | Wloczysiak | |
| 2015/0303973 A1 | 10/2015 | Wloczysiak | |
| 2015/0304000 A1 | 10/2015 | Wloczysiak | |
| 2015/0326244 A1 | 11/2015 | Wloczysiak | |
| 2016/0126987 A1 | 5/2016 | Wloczysiak | |
| 2016/0126993 A1 | 5/2016 | Wloczysiak | |
| 2016/0126994 A1 | 5/2016 | Domino et al. | |
| 2016/0127014 A1 | 5/2016 | Wloczysiak | |
| 2016/0127015 A1 | 5/2016 | Wloczysiak et al. | |
| 2016/0127025 A1 | 5/2016 | Wloczysiak | |
| 2016/0127026 A1 | 5/2016 | Wloczysiak et al. | |
| 2016/0127029 A1 | 5/2016 | Wloczysiak | |
| 2016/0322997 A1 | 11/2016 | Wloczysiak et al. | |
| 2016/0352373 A1 | 12/2016 | Wloczysiak | |
| 2016/0352374 A1 | 12/2016 | Wloczysiak | |
| 2017/0026061 A1 | 1/2017 | Wloczysiak | |
| 2017/0026090 A1 | 1/2017 | Wloczysiak | |
| 2017/0047981 A1 | 2/2017 | Wloczysiak | |
| 2017/0155421 A1 | 6/2017 | Wloczysiak | |
| 2017/0230088 A1 | 8/2017 | Wloczysiak | |
| 2017/0279436 A1 | 9/2017 | Domino et al. | |
| 2017/0279437 A1 | 9/2017 | Domino et al. | |
| 2017/0317710 A1 | 11/2017 | Liu et al. | |
| 2017/0324451 A1 | 11/2017 | Wloczysiak | |
| 2017/0346516 A1 | 11/2017 | Ripley et al. | |
| 2018/0048345 A1 | 2/2018 | Pehlke et al. | |
| 2018/0062682 A1 | 3/2018 | Wloczysiak et al. | |
| 2018/0063031 A1 | 3/2018 | Wloczysiak et al. | |
| 2018/0076834 A1 | 3/2018 | Wloczysiak et al. | |
| 2018/0205404 A1 | 7/2018 | Wloczysiak | |
| 2018/0241424 A1 | 8/2018 | Domino et al. | |
| 2018/0351594 A1 | 12/2018 | Wloczysiak et al. | |
| 2018/0351628 A1 | 12/2018 | Wloczysiak | |
| 2019/0013836 A1 | 1/2019 | Pehlke et al. | |

OTHER PUBLICATIONS

International Preliminary Report on Patentability for International Application No. PCT/US2019/020041, dated Sep. 8, 2020.

* cited by examiner

RADIO FREQUENCY SYSTEMS WITH TUNABLE FILTER

CROSS-REFERENCE TO RELATED APPLICATIONS

This application claims the benefit of priority under 35 U.S.C. § 119 of U.S. Provisional Patent Application No. 62/690,042, filed Jun. 26, 2018 and titled "RADIO FREQUENCY SYSTEMS WITH TUNABLE FILTER," and of Provisional Patent Application No. 62/638,452, filed Mar. 5, 2018 and titled "RADIO FREQUENCY SYSTEMS WITH TUNABLE FILTER," each of which is herein incorporated by reference in its entirety.

BACKGROUND

Field

Embodiments of the invention relate to electronic systems, and in particular, to radio frequency (RF) electronics.

Description of Related Technology

RF systems can be used for transmitting and/or receiving signals of a wide range of frequencies. For example, an RF system can be used to wirelessly transmit and receive RF signals in a frequency range of about 30 kilohertz (kHz) to 300 gigahertz (GHz), such as in the range of about 450 megahertz (MHz) to about 7 GHz for certain communications standards.

Examples of RF systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a first antenna and a front end circuit electrically coupled to the first antenna. The front end circuit includes a first radio frequency processing circuit implemented to support reception of a first frequency band of a first communication standard and a second frequency band of a second communication standard, the first radio frequency processing circuit including a tunable filter having adjustable bandwidth to control an amount of filtering provided to a blocker signal of a third frequency band. The front end circuit further includes a second radio frequency processing circuit configured to generate a transmit signal in the third frequency band.

In some embodiments, the mobile device further includes a second antenna configured to receive the transmit signal from the second radio frequency processing circuit, and the blocker signal arises from antenna-to-antenna coupling between the first antenna and the second antenna.

In a number of embodiments, the front end circuit further includes a diplexer configured to couple the first radio frequency processing circuit and the second radio frequency processing circuit to the first antenna, and the blocker signal arises from a finite isolation of the diplexer.

In some embodiments, the tunable filter operates with a first bandwidth in a first mode and with a second bandwidth in a second mode, the first mode providing a higher amount of filtering to the blocker signal than the second mode. According to several embodiments, first bandwidth is narrower than the second bandwidth. In accordance with various embodiments, the tunable filter has higher insertion loss in the first mode relative to the second mode. According to a number of embodiments, selection between the first mode and the second mode is controlled based on data received over a serial interface. In accordance with several embodiments, the front end circuit further includes a blocker detector configured to generate a detection signal based on detecting for the blocker signal, and the selection between the first mode and the second mode is controlled based on the detection signal. According to various embodiments, the detector is implemented along a radio frequency signal path through the first radio frequency processing circuit. In accordance with a number of embodiments, the detector is implemented along a radio frequency signal path through the second radio frequency processing circuit. According to several embodiments, the tunable filter includes a notch filter component that is activated in the first mode and deactivated in the second mode. In accordance with various embodiments, selection between the first mode and the second mode is controlled based on whether the second radio frequency processing circuit is transmitting the transmit signal.

In a number of embodiments, the third frequency band is of the second communication standard.

In several embodiments, the first communication standard is long term evolution (LTE) and the second communication standard is fifth generation (5G).

In various embodiments, the first frequency band is LTE B42, the second frequency band is 5G n77, and the third frequency band is 5G n79.

In certain embodiments, the present disclosure relates to a front end system. The front end system includes a first radio frequency processing circuit implemented to support reception of a first frequency band of a first communication standard and a second frequency band of a second communication standard. The first radio frequency processing circuit includes a tunable filter having adjustable bandwidth to control an amount of filtering provided to a blocker signal of a third frequency band. The front end system further includes a second radio frequency processing circuit configured to generate a transmit signal in the third frequency band.

In a number of embodiments, the tunable filter operates with a first bandwidth in a first mode and with a second bandwidth in a second mode, the first mode providing a higher amount of filtering to the blocker signal than the second mode.

In certain embodiments, the present disclosure relates to a method of radio frequency communication. The method includes receiving a first signal and a second signal via an antenna, the first signal of a first frequency band of a first communication standard and the second signal of a second frequency band of a second communication standard. The method further includes processing the first signal and the second signal using a first radio frequency processing circuit, transmitting a transmit signal in a third frequency band using a second radio frequency processing circuit, and controlling an amount of filtering provided to a blocker signal of the third frequency band by adjusting a bandwidth of a tunable filter of the first radio frequency processing circuit.

In several embodiments, controlling the amount of filtering includes operating the tunable filter with a first bandwidth in a first mode and with a second bandwidth in a second mode, the first mode providing a greater amount of filtering to the blocker signal than the second mode.

In a number of embodiments, the first bandwidth is narrower than the second bandwidth.

In certain embodiments, the present disclosure relates to a mobile device including a first antenna and a front end circuit electrically coupled to the first antenna and including a first radio frequency processing circuit implemented to support reception of a first frequency band of a first communication standard and a second frequency band of a second communication standard. The first radio frequency processing circuit including a tunable filter having adjustable bandwidth to control an amount of filtering provided to a blocker signal of a third frequency band.

In some embodiments, the front end circuit further includes a second radio frequency processing circuit configured to generate a transmit signal in the third frequency band. According to several embodiments, the mobile device further includes a second antenna configured to receive the transmit signal from the second radio frequency processing circuit, the blocker signal arising from antenna-to-antenna coupling between the first antenna and the second antenna. In accordance with various embodiments, the front end circuit further includes a diplexer configured to couple the first and second radio frequency processing circuits to the first antenna, the blocker signal arising from a finite isolation of the diplexer. According to a number of embodiments, the first radio frequency processing circuit is implemented on a first radio frequency module and the second radio frequency processing circuit is implemented on a second radio frequency module.

In several embodiments, the tunable filter operates with a first bandwidth in a first mode and with a second bandwidth in a second mode, the first mode providing a higher amount of filtering to the blocker signal than the second mode. According to a number of embodiments, the first bandwidth is narrower than the second bandwidth. In accordance with various embodiments, the tunable filter has higher insertion loss in the first mode relative to the second mode. According to some embodiments, selection between the first mode and the second mode is controlled based on data received over a serial interface. In accordance with a number of embodiments, the mobile device further includes a system-level control circuit configured to control selection between the first mode and the second mode. According to various embodiments, the system-level control circuit is a transceiver or a baseband processor. In accordance with some embodiments, the front end circuit further includes a blocker detector configured to generate a detection signal based on detecting for the blocker signal, the selection between the first mode and the second mode controlled based on the detection signal. According to a number of embodiments, the detector is implemented along a radio frequency signal path through the first radio frequency processing circuit. In accordance with various embodiments, the front end circuit further includes a second radio frequency processing circuit, the detector implemented along a radio frequency signal path through the second radio frequency processing circuit. According to a number of embodiments, the tunable filter includes a notch filter component that is activated in the first mode and deactivated in the second mode. In accordance with various embodiments, the front end circuit further includes a second radio frequency processing circuit configured to generate a transmit signal of the third frequency band, the selection between the first mode and the second mode controlled based on whether the second radio frequency processing circuit is transmitting the transmit signal.

In some embodiments, the third frequency band is of the second communication standard.

In a number of embodiments, the first communication standard is long term evolution (LTE) and the second communication standard is fifth generation (5G).

In several embodiments, the first communication standard is WiFi and the second communication standard is 5G.

In various embodiments, the first communication standard is WiFi and the second communication standard is LTE.

In some embodiments, the first frequency band is LTE B42 and the second frequency band is 5G n77. According to several embodiments, the third frequency band is 5G n79.

In a number of embodiments, the first frequency band and the second frequency band are partially overlapping in frequency.

In several embodiments, the tunable filter is configured to generate a filtered signal based on filtering a radio frequency input signal to the first radio frequency processing circuit. According to various embodiments, the first radio frequency processing circuit further includes a low noise amplifier configured to generate an amplified signal by amplifying the filtered signal, and a tunable output filter configured to filter the amplified signal.

In some embodiments, the mobile device further includes a transceiver electrically coupled to the front end circuit.

In certain embodiments, the present disclosure relates to a radio frequency module including a module substrate and a radio frequency processing circuit implemented on the module substrate. The radio frequency processing circuit is configured to receive a first radio frequency signal of a first frequency band, the radio frequency processing circuit including a tunable filter having adjustable bandwidth to control an amount of filtering provided to a blocker signal of a second frequency band.

In some embodiments, the first frequency band is LTE B42 and the second frequency band is 5G n79. According to several embodiments, the first frequency band is 5G n79 and the second frequency band is 5 gigahertz WiFi. In accordance with a number of embodiments, first frequency band is B40 and the second frequency band is 2 gigahertz WiFi. According to various embodiments, the first frequency band is B41 and the second frequency band is 2 gigahertz WiFi. In accordance with several embodiments, the first frequency band is B32 and the second frequency band is B11/B21. According to a number of embodiments, the first frequency band is of a first communication standard and the second frequency band is of a second communication standard. In accordance with various embodiments, the first communication standard is LTE and the second communication standard is 5G. According to several embodiments, the first communication standard is WiFi and the second communication standard is 5G. In accordance with a number of embodiments, the first communication standard is WiFi and the second communication standard is LTE. According to several embodiments, the radio frequency processing circuit is further configured to receive a second radio frequency signal of the second communication standard. In accordance with various embodiments, the first radio frequency signal is in LTE B42 and the second radio frequency signal is in 5G n77. According to a number of embodiments, the blocker signal is in 5G n79.

In some embodiments, the tunable filter operates with a first bandwidth in a first mode and with a second bandwidth in a second mode, the first mode providing a higher amount of filtering to the blocker signal than the second mode. According to several embodiments, the first bandwidth is narrower than the second bandwidth. In accordance with various embodiments, the tunable filter has higher insertion loss in the first mode relative to the second mode. According to a number of embodiments, the radio frequency module further includes a serial interface configured to receive data for controlling selection between the first mode and the second mode. In accordance with several embodiments, the radio frequency processing circuit includes a blocker detector configured to generate a detection signal based on detecting for the blocker signal, and the selection between the first mode and the second mode is controlled based on the detection signal. According to various embodiments, the tunable filter includes a notch filter component that is activated in the first mode and deactivated in the second mode. In accordance with a number of embodiments, the tunable filter is configured to generate a filtered signal based on filtering the first radio frequency signal. According to several embodiments, the radio frequency processing circuit further includes a low noise amplifier configured to generate an amplified signal by amplifying the filtered signal, and a tunable output filter configured to filter the amplified signal. In accordance with various embodiments, the radio frequency processing circuit is implemented at least in part on a semiconductor die that is attached to the module substrate.

In certain embodiments, the present disclosure relates to a method of radio frequency communication. The method includes receiving a first signal of a first frequency band of a first communication standard via an antenna, processing the first signal using a first radio frequency processing circuit, receiving a second signal of a second frequency band of a second communication standard via the antenna, processing the second signal using the first radio frequency processing circuit, and controlling an amount of filtering provided to a blocker signal of a third frequency band by adjusting a bandwidth of a tunable filter of the first radio frequency processing circuit.

In various embodiments, the method further includes transmitting a transmit signal in the third frequency band using a second radio frequency processing circuit.

In several embodiments, controlling the amount of filtering includes operating the tunable filter with a first bandwidth in a first mode and with a second bandwidth in a second mode, the first mode providing a greater amount of filtering to the blocker signal than the second mode. According to a number of embodiments, the first bandwidth is narrower than the second bandwidth. In accordance with some embodiments, the tunable filter has higher insertion loss in the first mode relative to the second mode. According to several embodiments, the method further includes receiving data over a serial interface, and controlling selection between the first mode and the second mode based on the data

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
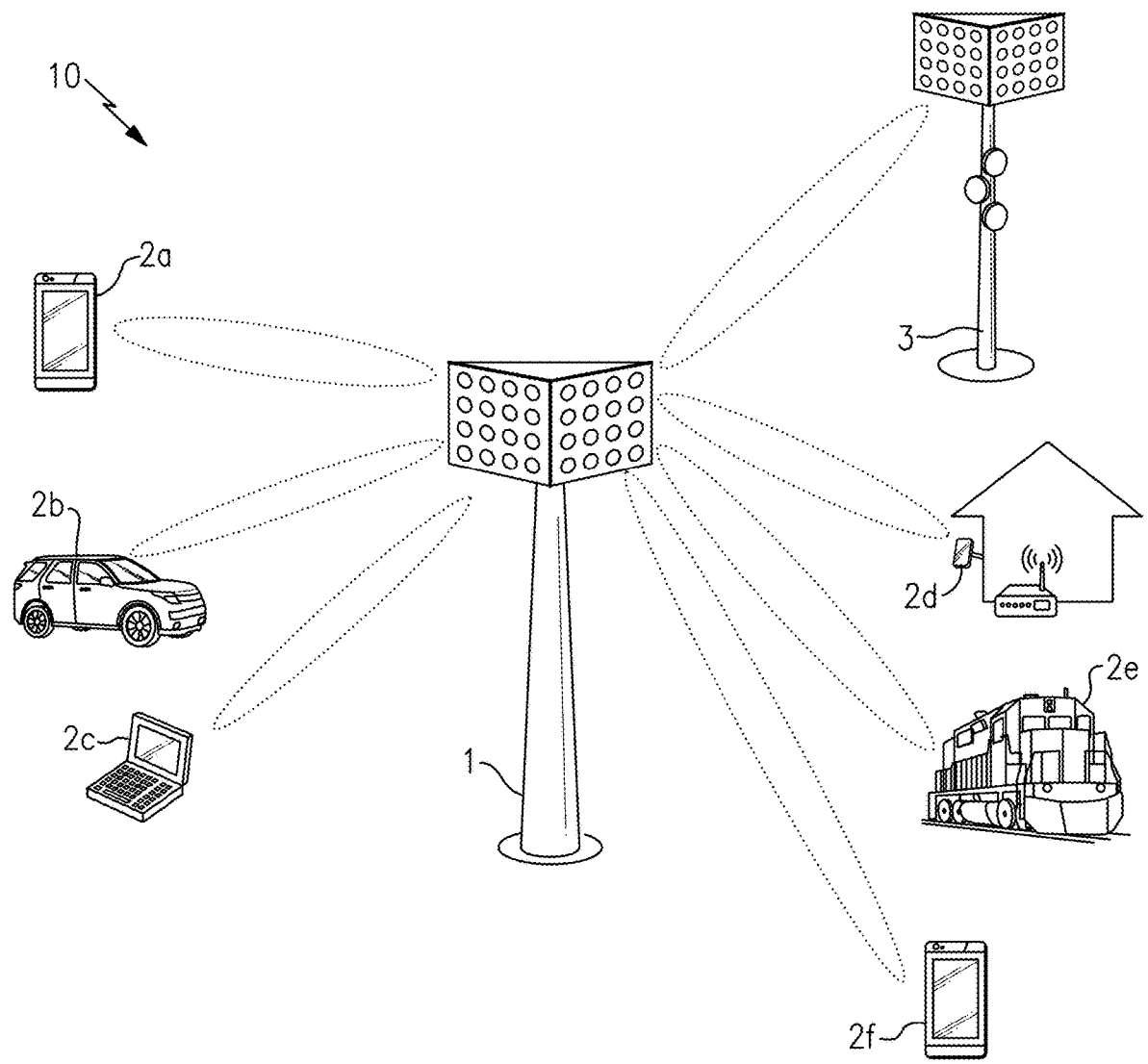
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings in which like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of RF systems, including, but not limited to, RF systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of technologies, including, for example, 4G LTE, 5G NR, and wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD)

and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
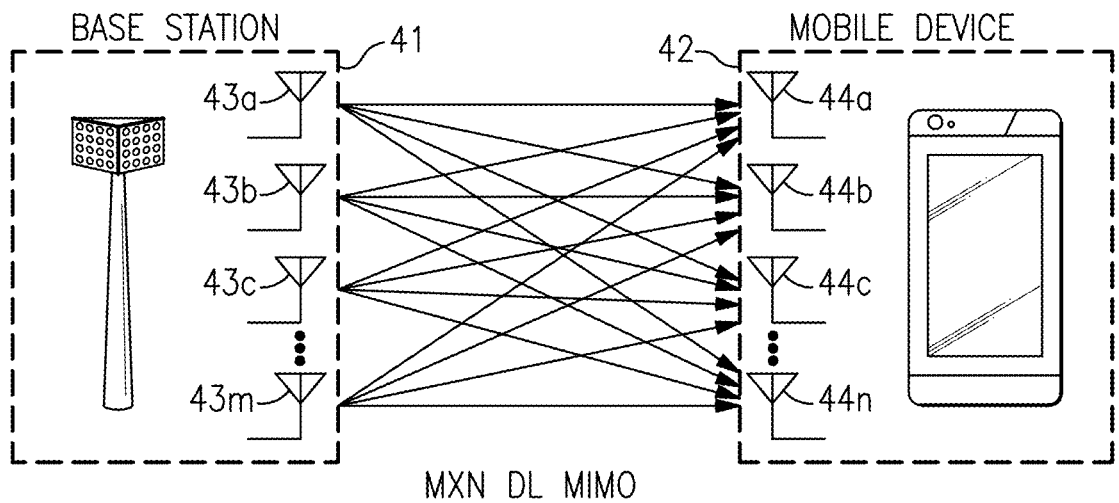
FIG. 2A is a schematic diagram of one example of a downlink channel using multi-input and multi-output (MIMO) communications.
Figure 2B:
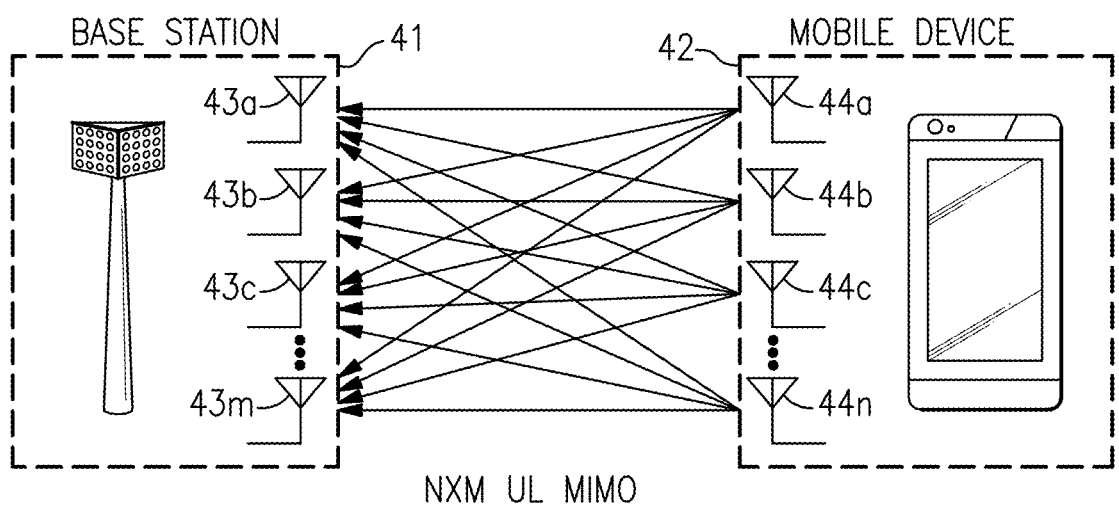
FIG. 2B is schematic diagram of one example of an uplink channel using MIMO communications.

FIG. 2A is a schematic diagram of one example of a downlink channel using multi-input and multi-output (MIMO) communications. FIG. 2B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 2A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 2A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 2B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 2B illustrates an example of N×M UL MIMO.

By increasing the level or order of MIMO, bandwidth of an uplink channel and/or a downlink channel can be increased.

MIMO communications are applicable to communication links of a variety of types, such as FDD communication links and TDD communication links.

Examples of Radio Frequency Electronics with Tunable Filter

Certain RF systems communicate using multiple communication standards, for instance, 4G LTE, 5G, and/or WiFi. One communication standard can specify communication over a frequency band that is relatively close in proximity to and/or overlapping in frequency with a frequency band of a different communication standard. In one example, LTE band B42 operates over a frequency range of about 3.4 GHz to 3.6 GHz, while 5G band n77 operates over a frequency range of about 3.3 GHz to 4.2 GHz.

To provide support for both frequency bands, an RF system can include an RF processing circuit supporting a frequency range covering both of the nearby bands of the different communication standards. For instance, with respect to LTE band B42 and 5G band n77, the RF processing circuit can be implemented to receive signals over a frequency range of about 3.3 GHz to 4.2 GHz, thereby supporting handling of both RF signals in LTE band B42 and RF signals in 5G band n77.

Although implementing an RF processing circuit in this manner lowers cost and/or area of the RF system by sharing resources and reducing component count, widening the bandwidth of the RF processing circuit can also increase exposure to blocker or jammer signals.

For example, in the context of an RF processing circuit that supports 3.3 GHz to 4.2 GHz to process both LTE band B42 and 5G band n77, a transmit signal from 5G band n79 (about 4.4 GHz to 5 GHz) can operate as a strong interferer for the RF processing circuit when receiving LTE band B42. In particular, since the RF processing circuit is implemented to cover not only the frequency range of LTE band B42 but also the frequency range of 5G band n77, the ability of the RF processing circuit to receive LTE band B42 is degraded in the presence of a 5G band n79 blocker or jammer signal.

RF systems with tunable filters are provided herein. In certain embodiments, an RF system includes a first RF processing circuit configured to process a first frequency band of a first communication standard and a second frequency band of a second communication standard. The first frequency band and the second frequency band are close in frequency and/or partially overlapping in frequency. The first RF processing circuit includes a tunable filter for changing the bandwidth of the first RF processing circuit to enhance the robustness of the first RF processing circuit to blocker or jammer signals of a third frequency band.

In certain implementations, the first RF processing circuit operates with a first bandwidth in a first mode and with a second bandwidth in a second mode. The first bandwidth can provide the first RF processing circuit with superior blocker protection, for instance, the first bandwidth can be narrower in frequency range to provide higher blocker immunity. In certain configurations, the first RF processing circuit also has a higher signal loss in the first mode relative to the second mode. In such configurations, the first RF processing circuit can have higher blocker suppression but lower receive sensitivity in the first mode relative to the second mode.

The first RF processing circuit can be controlled between the first mode and the second mode in a variety of ways. For example, in certain implementations, a system-level control circuit, such as a transceiver or baseband processor, controls mode selection, for instance, via digital data provided over an interface.

Mode can also be selected based at least in part on whether a presence of the blocker signal is detected. For instance, a detector can be included along an RF signal path through the first RF processing circuit and/or along another suitable RF signal path to monitor for presence of the blocker signal.

In certain implementations, the RF system further includes a second RF processing circuit that generates a transmit signal in the third frequency band. The transmit signal has the propensity to jam the first RF processing circuit when the first RF processing circuit is receiving the first frequency band. For instance, the blocker signal can arise from the transmit signal due to finite isolation of a frequency multiplexer (for instance, a diplexer, a triplexer, etc.) or other components (for instance, switches, duplexers, etc.) and/or from antenna-to-antenna coupling etc. To provide enhanced blocker suppression, selection between the first mode and the second mode can be based on whether the second RF processing circuit is transmitting. For example, the first mode can be selected when the second RF processing circuit is transmitting and the first RF processing circuit is receiving in the first frequency band.

The tunable filter can be implemented in a wide variety of ways, including using switches to control bandwidth. For example, in certain implementations, a shunt notch filter is switched in or out of an RF signal path through the first RF processing circuit to control bandwidth.

Figure 3:
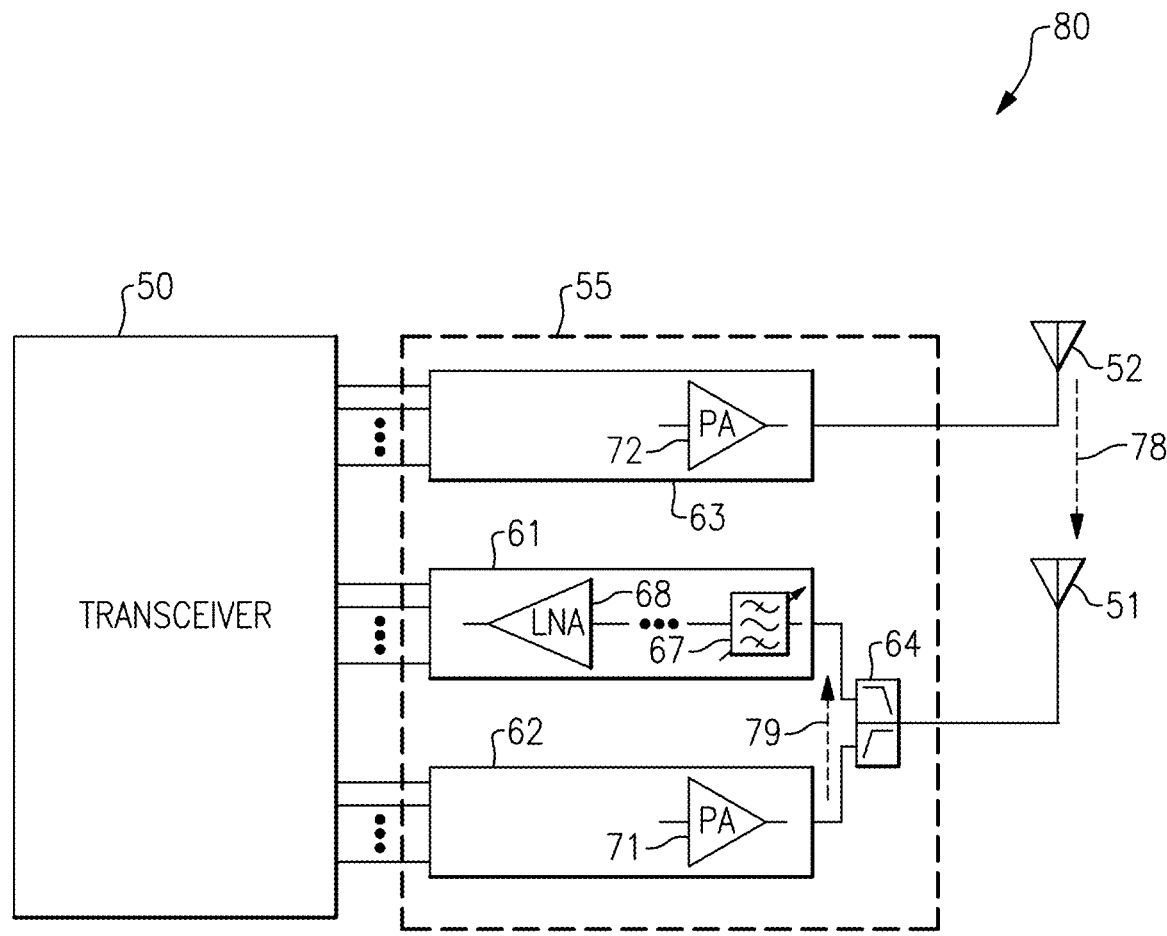
FIG. 3 is a schematic diagram of a radio frequency (RF) system including a front end circuit according to one embodiment.

FIG. 3 is a schematic diagram of one embodiment of an RF system 80. The RF system 80 includes a transceiver 50, a first antenna 51, a second antenna 52, and a front end circuit 55. Although FIG. 3 illustrates one embodiment of an RF system, the teachings herein are applicable to RF systems implemented in a wide variety of ways.

The front end circuit 55 can provide a number of functionalities associated with, for example, MIMO communications, switching between different bands, carrier aggregation, switching between different power modes, filtering of signals, duplexing of signals, and/or some combination thereof. In the illustrated embodiment, the front end circuit 55 includes a first RF signal processing circuit 61, a second RF signal processing circuit 62, a third RF signal processing circuit 63, and a diplexer 64.

Although one embodiment of a front end circuit is shown, the teachings herein are applicable to front end circuits implemented in a wide variety of ways. A front end circuit, such as the front end circuit 55 of FIG. 3, is also referred to herein as a front end system.

As shown in FIG. 3, the first RF signal processing circuit 61 includes a tunable filter 67 and a low noise amplifier (LNA) 68 for amplifying a filtered signal generated by the tunable filter 67. Additionally, the tunable filter 67 receives an input signal from the first antenna 51 via the diplexer 64. In certain implementations, the first RF signal processing circuit 61 is implemented on a module, for instance, a multi-chip module (MCM). Although illustrated as including the tunable filter 67 and the LNA 68, other implementations are possible, such as configurations in which the RF signal processing circuit 61 includes additional components, for instance, one or more switches, one or more power amplifiers, and/or other circuitry.

The second RF signal processing circuit 62 includes a first power amplifier 71, which provides a first amplified RF signal to the first antenna 51 via the diplexer 64. In certain implementations, the second RF signal processing circuit 62 is implemented on a module, for instance, an MCM. Although illustrated as including only the power amplifier 71, the second RF signal processing circuit 62 can include additional components.

The third RF processing circuit 63 includes a second power amplifier 72, which provides a second amplified RF signal to the second antenna 52. In certain implementations, the third RF signal processing circuit 63 is implemented on a module, for instance, an MCM. Although illustrated as including only the power amplifier 72, the third RF signal processing circuit 63 can include additional components.

As shown in FIG. 3, the front end circuit 55 is connected to the transceiver 50 by various connections, which can include one or more RF signal routes to the first RF signal processing circuit 61, the second RF signal processing circuit 62, and/or the third RF signal processing circuit 63. In certain implementations, the connections further include a digital interface, such as a mobile industry processor interface radio frequency front end (MIPI RFFE) bus, an inter-integrated circuit (I²C) bus, and/or other suitable interface.

In the illustrated embodiment, the first RF signal processing circuit 61 is implemented to support reception of a first frequency band of a first communication standard and a second frequency band of a second communication standard. In one embodiment, the first frequency band is LTE B42 and the second frequency band is 5G n77. The first radio frequency processing circuit 61 includes the tunable filter 67 having adjustable bandwidth to control an amount of filtering provided to a blocker signal of a third frequency band. In one embodiment the third frequency band is 5G n79.

The blocker signal can arise from transmission within the RF system 80. For example, the power amplifier 71 of the second RF processing circuit 62 and/or the power amplifier 72 of the third RF processing circuit 63 can generate a transmit signal in the third frequency band. Additionally or alternatively, antenna-to-antenna coupling 78 between the first antenna 51 and the second antenna 52 and/or leakage 79 from finite isolation of the diplexer 64 can lead to generation of the blocker signal.

Figure 4A:
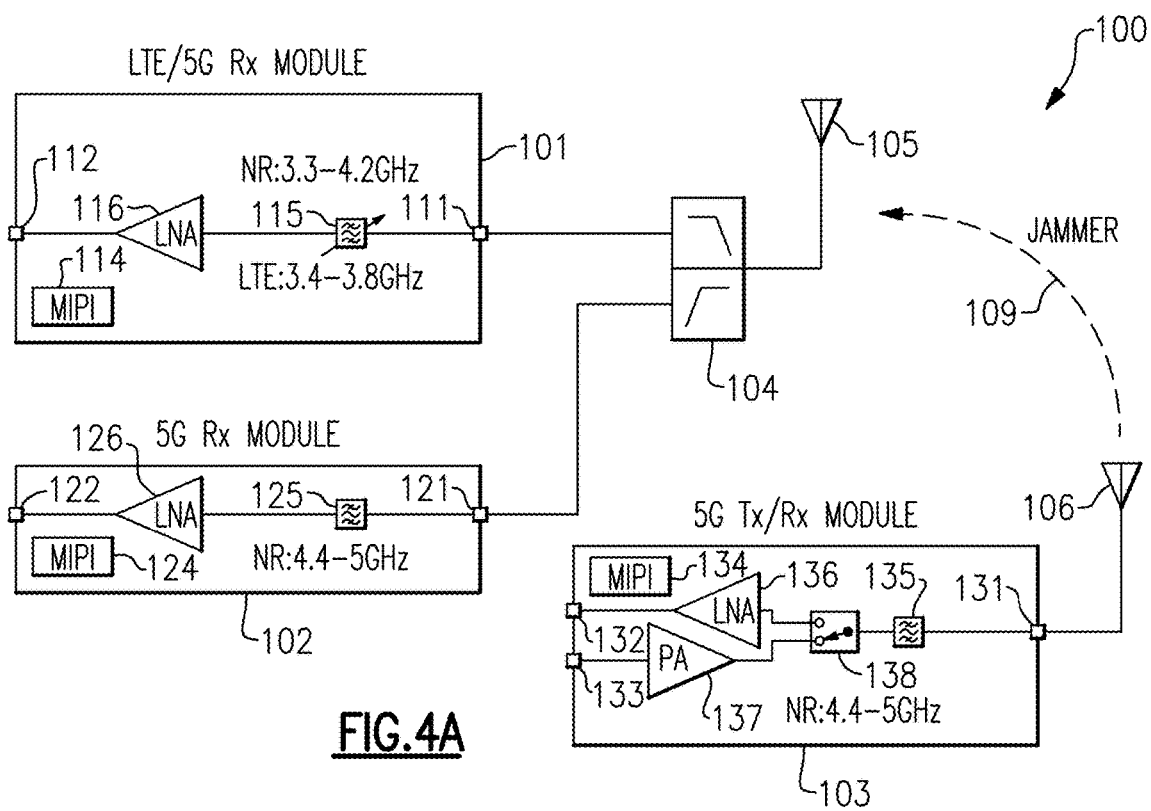
FIG. 4A is a schematic diagram of another embodiment of a front end circuit.

FIG. 4A is a schematic diagram of another embodiment of a front end circuit 100. The front end circuit 100 includes an LTE/5G receive (Rx) module 101, a 5G receive module 102, a 5G transmit/receive (Tx/Rx) module 103, a frequency multiplexer 104 (diplexer, in this example), a first antenna 105, and a second antenna 106. Although FIG. 4A illustrates one embodiment of an RF system, the teachings herein are applicable to RF systems implemented in a wide variety of ways.

In the illustrated embodiment, the LTE/5G receive module 101 includes an antenna pin 111, a receive output pin 112, a serial interface 114 (MIPI RFFE bus, in this example), a tunable filter 115, and an LNA 116. Additionally, the 5G receive module 102 includes an antenna pin 121, a receive output pin 122, a serial interface 124, a bandpass filter 125, and an LNA 126. Furthermore, the 5G transmit/receive module 103 includes an antenna pin 131, a receive output pin 132, a transmit input pin 133, a serial interface 134, a bandpass filter 135, an LNA 136, and a power amplifier 137.

Although various example implementations of the modules are shown, the teachings herein are applicable to other implementations of modules, including, for example, configurations including more or fewer components and/or a different arrangement of components. Additionally, although certain modules are indicated as having transmit and/or receive functionality, the modules can be adapted to provide functionality desired for a particular application and/or implementation. For example, in another embodiment the module 101 and/or the module 102 is also implemented with transmit functionality.

The front end circuit 100 illustrates one example of 5G/LTE jammer coupling 109 through antenna-to-antenna isolation. In the illustrated embodiment, the tunable filter 115 is included in the LTE/5G receive module 101 to provide coexistence. In certain implementations, the tunable filter 115 is implemented as a switchable 5G/LTE filter that provides for coexistence with close in proximity bands (for instance n79, in a frequency range of about 4.4 GHz to 5 GHz). In this example, B42 receiving occurs via the first antenna 105, while n79 transmitting occurs via the second antenna 106.

Figure 4B:
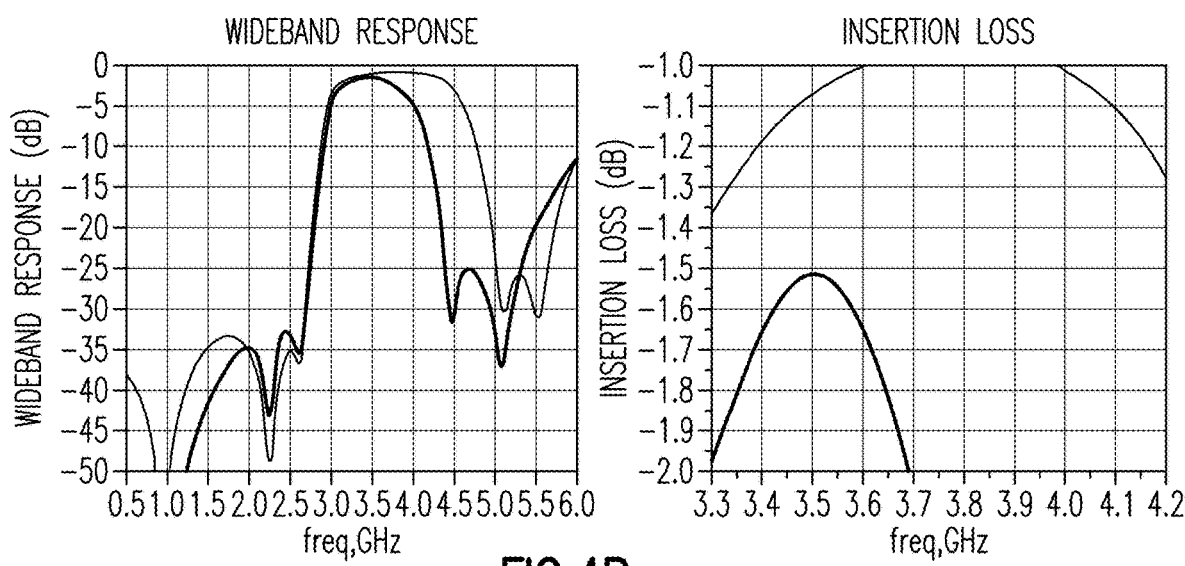
FIG. 4B is a diagram showing one example of simulation results for the front end circuit of FIG. 4A.

FIG. 4B is a diagram showing one example of simulation results for the front end circuit 100 of FIG. 4A. The simulation results include a first graph of wideband response versus frequency, and a second graph of insertion loss versus frequency. The simulation results correspond to one implementation of the tunable filter 115 implemented as a switchable 5G/LTE filter. Plots are included for each graph for the switchable 5G/LTE filter in a first mode and in a second mode.

For the illustrated embodiment, narrowing the bandwidth of the LTE/5G receive module 101 using the module's tunable filter results in not only narrower bandwidth, but also a greater amount of insertion loss.

Figure 4C:
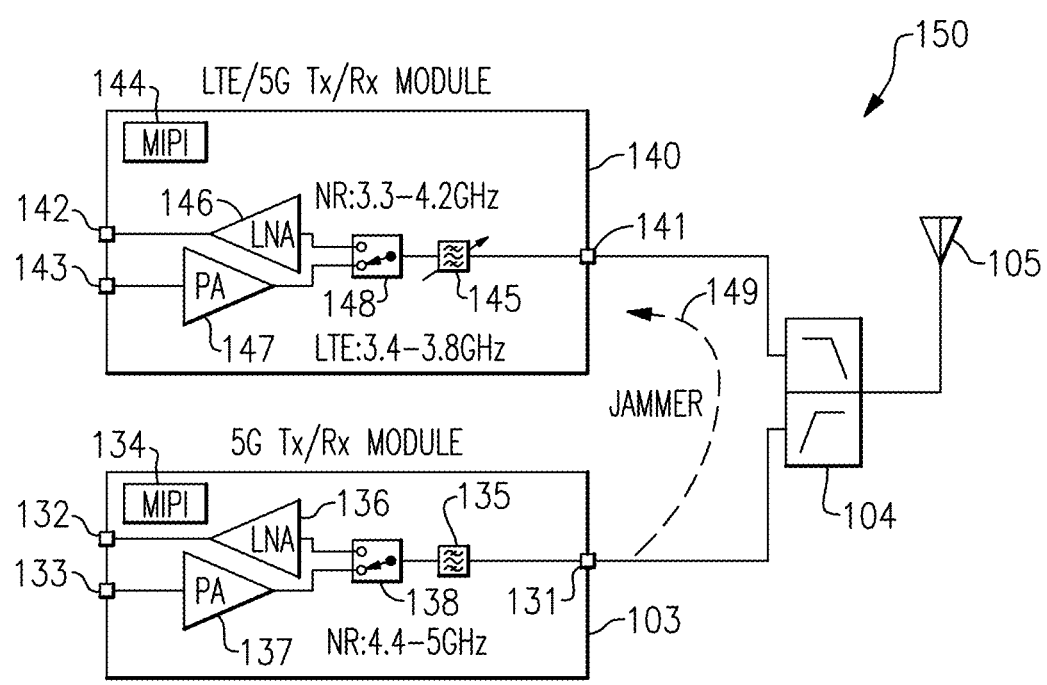
FIG. 4C is a schematic diagram of another embodiment of a front end circuit.

FIG. 4C is a schematic diagram of another embodiment of a front end circuit 150. The front end circuit 150 includes an LTE/5G transmit/receive module 140, a 5G transmit/receive module 103, a diplexer 104, and an antenna 105.

In the illustrated embodiment, the LTE/5G transmit/receive module 140 includes an antenna pin 141, a receive output pin 142, a transmit input pin 143, a serial interface 144, a tunable filter 145, an LNA 146, a power amplifier 147, and a switch 148. Additionally, the 5G transmit/receive module 103 includes an antenna pin 131, a receive output pin 132, a transmit input pin 133, a serial interface 134, a bandpass filter 135, an LNA 136, and a power amplifier 137.

Although various example implementations of the modules are shown, the teachings herein are applicable to other implementations of modules, including, for example, configurations including more or fewer components and/or a different arrangement of components.

The front end circuit 150 illustrates one example of 5G/LTE jammer coupling 149 through diplexer isolation. In the illustrated embodiment, the tunable filter 145 is included in the LTE/5G transmit/receive module 140 to provide coexistence. In certain implementations, the tunable filter 145 is implemented as a switchable 5G/LTE to provide for coexistence with close in proximity bands (for instance, n79). In this example, B42 receiving and n79 transmitting occurs via the antenna 105.

Figure 4D:
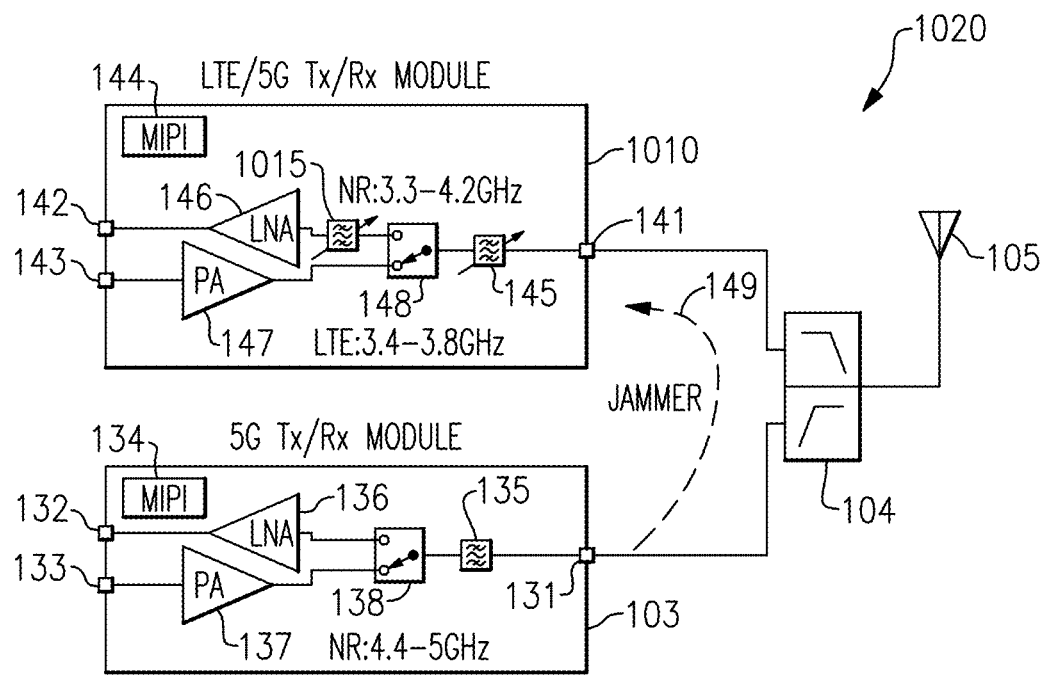
FIG. 4D is a schematic diagram of another embodiment of a front end circuit.

FIG. 4D is a schematic diagram of another embodiment of a front end circuit 1020. The front end circuit 1020 includes an LTE/5G transmit/receive module 1010, a 5G transmit/receive module 103, a diplexer 104, and an antenna 105.

The front end circuit 1020 of FIG. 4D is similar to the front end circuit 150 of FIG. 4C, except that the front end circuit 1020 includes an implementation of tunable filtering including multiple tunable filters. For example, in comparison to the LTE/5G transmit/receive module 140 of FIG. 4C, the LTE/5G transmit/receive module 1010 of FIG. 4D includes both a first tunable filter 145 between the antenna pin 141 and the switch 148 and a second tunable filter 1015 between the switch 148 and an input to the LNA 146.

Figure 4E:
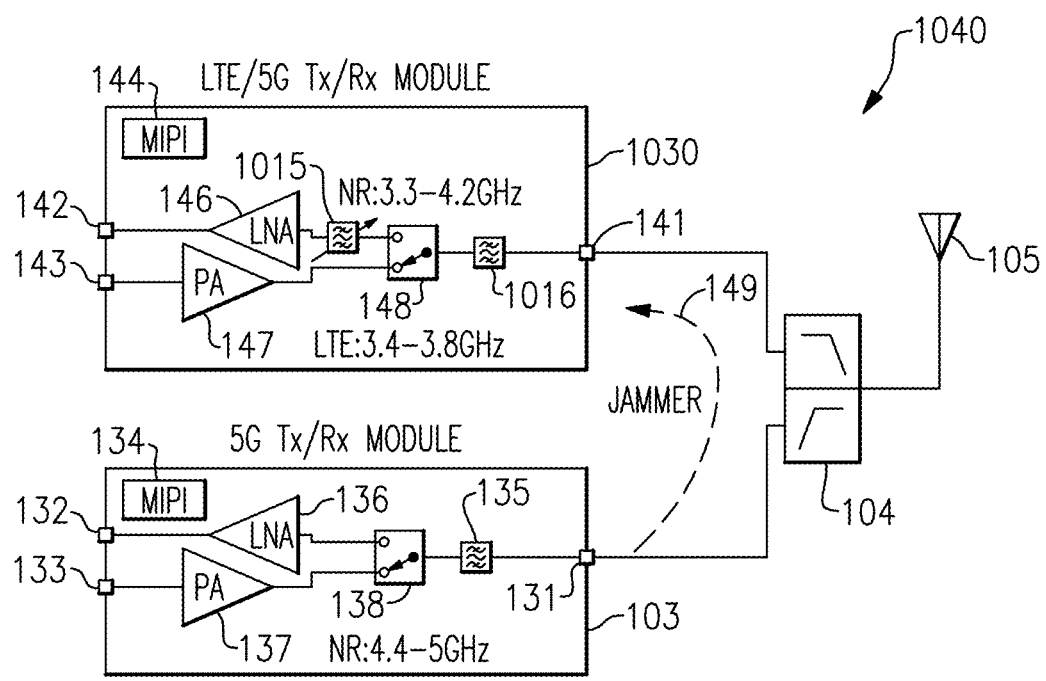
FIG. 4E is a schematic diagram of another embodiment of a front end circuit.

FIG. 4E is a schematic diagram of another embodiment of a front end circuit 1040. The front end circuit 1040 includes an LTE/5G transmit/receive module 1030, a 5G transmit/receive module 103, a diplexer 104, and an antenna 105. The front end circuit 1040 of FIG. 4E is similar to the front end circuit 1020 of FIG. 4D, except that the front end circuit 1040 includes an implementation of filtering including a fixed filter and a tunable filter. For example, in comparison to the LTE/5G transmit/receive module 1010 of FIG. 4D that includes two tunable filters, the LTE/5G transmit/receive module 1030 of FIG. 4E includes a tunable filter 1015 between the switch 148 and an input to the LNA 146 and a fixed filter 1016 between the antenna pin 141 and the switch 148.

Figure 4F:
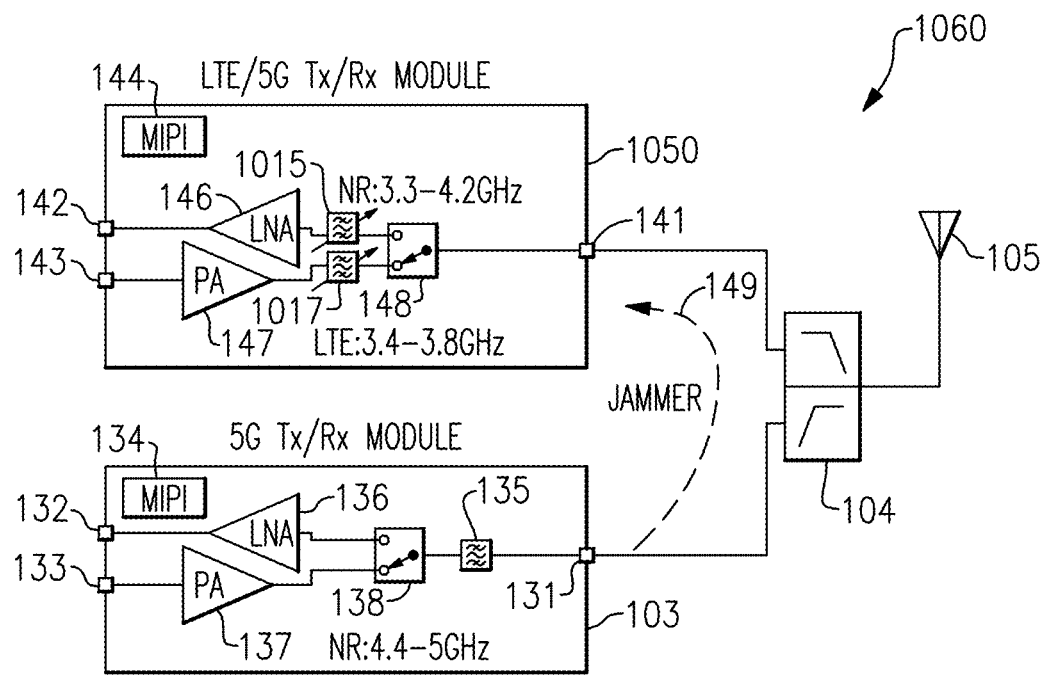
FIG. 4F is a schematic diagram of another embodiment of a front end circuit.

FIG. 4F is a schematic diagram of another embodiment of a front end circuit 1060. The front end circuit 1060 includes an LTE/5G transmit/receive module 1050, a 5G transmit/receive module 103, a diplexer 104, and an antenna 105.

The front end circuit 1060 of FIG. 4F is similar to the front end circuit 150 of FIG. 4C, except that the front end circuit 1060 includes an implementation of tunable filtering in which separate tunable receive and tunable transmit filters are provided. For example, in comparison to the LTE/5G transmit/receive module 140 of FIG. 4C, the LTE/5G transmit/receive module 1050 of FIG. 4F omits the tunable filter 145 in favor of including a tunable receive filter 1015 between a first throw of the switch 148 and an input to the LNA 146 and a tunable transmit filter 1017 between a second throw of the switch 148 and an output of the power amplifier 147.

Figure 4G:
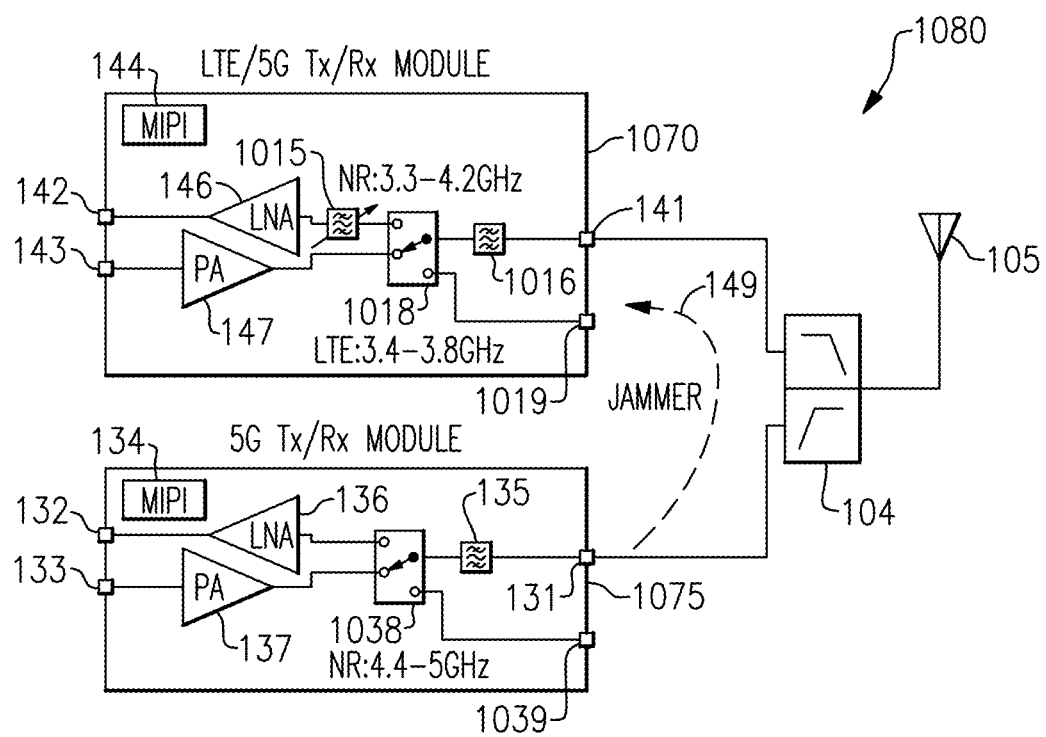
FIG. 4G is a schematic diagram of another embodiment of a front end circuit.

FIG. 4G is a schematic diagram of another embodiment of a front end circuit 1080. The front end circuit 1080 includes an LTE/5G transmit/receive module 1070, a 5G transmit/receive module 1075, a diplexer 104, and an antenna 105.

The front end circuit 1080 of FIG. 4G is similar to the front end circuit 1040 of FIG. 4E, except that the front end circuit 1080 includes an implementation of switches with an additional throw for connecting to bypass terminals. For example, in comparison to the LTE/5G transmit/receive module 1030 of FIG. 4E, the LTE/5G transmit/receive module 1070 of FIG. 4G includes a bypass terminal 1019 and a switch 1018 having a third throw coupled to the bypass terminal 1019. Additionally, in comparison to the 5G transmit/receive module 103 of FIG. 4E, the 5G transmit/receive module 1075 of FIG. 4G includes a bypass terminal 1039 and a switch 1038 having an additional throw coupled to the bypass terminal 1039.

The bypass terminal 1019 and the bypass terminal 1039 can be used for a wide variety of functions. For example, in a 4×4 MIMO application, including the bypass terminals provides the ability to route any transmit signal to any of the four antennas for sounding the RF propagation channel of each antenna path to improve MIMO performance.

Figure 4H:
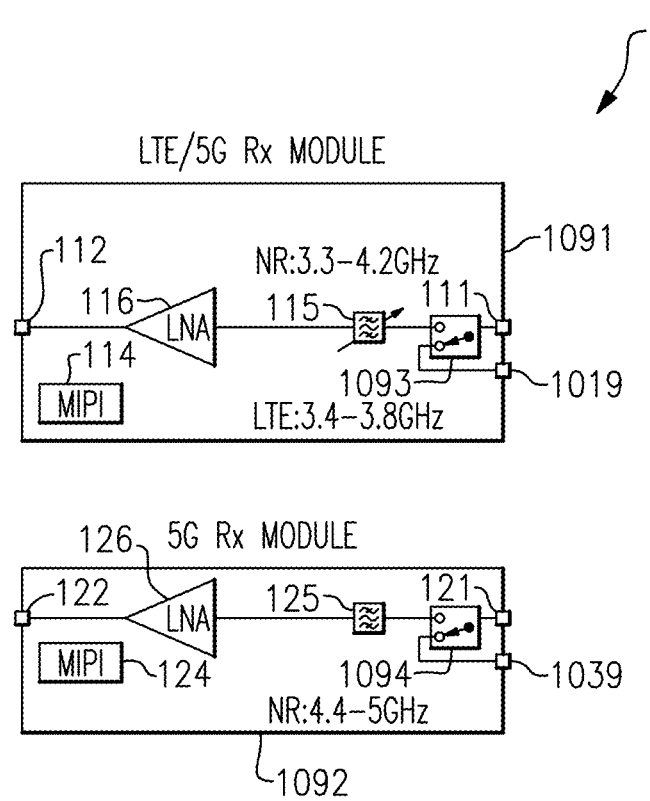
FIG. 4H is a schematic diagram of another embodiment of a front end circuit.

FIG. 4H is a schematic diagram of another embodiment of a front end circuit 1090. The front end circuit 1090 includes a LTE/5G receive module 1091 and a 5G receive module 1092.

The LTE/5G receive module 1091 of FIG. 4H is similar to the LTE/5G receive module 101 of FIG. 4A, except that the LTE/5G receive module 1091 further includes a switch 1093 and a bypass terminal 1019. Additionally, the 5G receive module 1092 of FIG. 4H is similar to the 5G receive module 102 of FIG. 4A, except that the 5G receive module 1092 further includes a switch 1094 and a bypass terminal 1039.

Figure 5A:
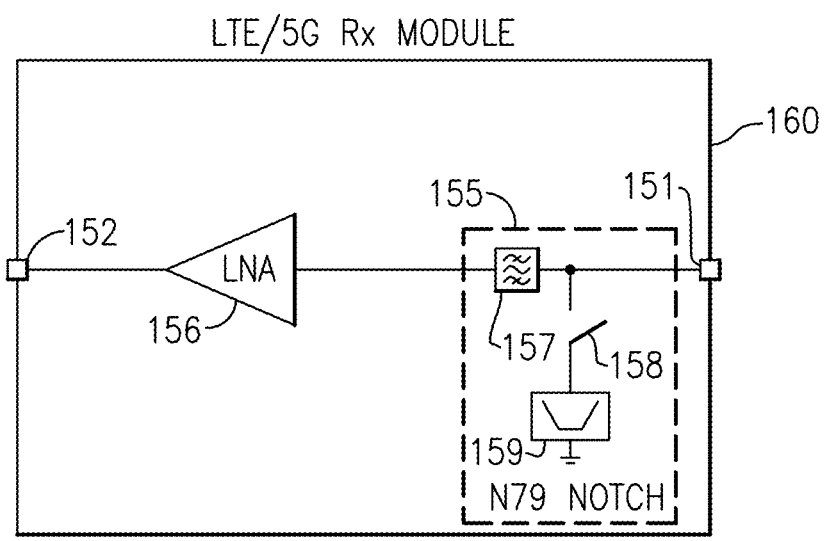
FIG. 5A is a schematic diagram of one embodiment of an RF module.

FIG. 5A is a schematic diagram of one embodiment of an RF module 160. The RF module 160 includes an antenna pin 151, a receive output pin 152, a tunable filter 155, and an LNA 156. In the illustrated embodiment, the RF module 160 is an LTE/5G receive module. Although FIG. 5A illustrates one embodiment of an RF module, the teachings herein are applicable to RF modules implemented in a wide variety of ways.

In the illustrated embodiment, the tunable filter 155 includes a bandpass filter 157, a shunt switch 158, and a notch filter 159. The shunt switch 158 and the notch filter 159 operate in combination with one another as a switchable notch filter circuit that controls a bandwidth processed by the RF module 160. In certain implementations, the notch filter 159 provides a notch in frequency within the 5G n79 band.

The state of the shunt switch 158 operates to control the bandwidth of the RF module 160. In certain implementations, tunable filter 155 passes a frequency range between about 3.4 GHz and about 3.8 GHz in a first state of the shunt switch 158, and passes a frequency range between about 3.3 GHz and about 4.2 GHz in a second state of the shunt switch 158. The state of the shunt switch 158 can be controlled in a wide variety of ways, including, but not limited to, via data received over a serial interface or bus.

Accordingly, in certain implementations, an RF module operates with a first bandwidth in a first mode and with a second bandwidth in a second mode. The first bandwidth can provide the RF module with superior blocker protection, for instance, the first bandwidth can be narrower in frequency range to provide higher blocker immunity. In certain configurations, the RF module also has a higher signal loss in the first mode relative to the second mode. In such configurations, the RF module can have higher blocker suppression but lower receive sensitivity in the first mode relative to the second mode.

Figure 5B:
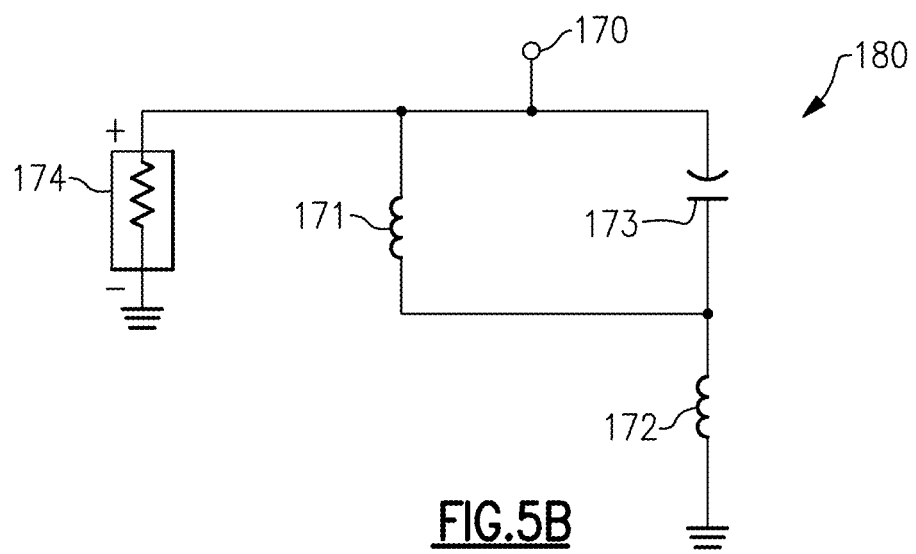
FIG. 5B is a schematic diagram of one embodiment of a notch filter circuit for a tunable filter.

FIG. 5B is a schematic diagram of one embodiment of a notch filter circuit 180 for a tunable filter. The notch filter circuit 180 illustrates one example of a suitable notch filter circuit for providing frequency tuning. For example, the notch filter circuit 180 illustrates one implementation of the notch filter 159 of FIG. 5A.

Although one implementation of a notch filter is shown, a notch filter can be implemented in a wide variety of ways. Furthermore, although a tunable filter can be implemented with a switchable notch filter, other implementations of tunable filters can be used. For example, the teachings herein are applicable to tunable filters implemented in a wide variety of ways, including, for example, tunable filters that operate without switchable notch filters.

In the illustrated embodiment, the notch filter 180 includes a signal port 170, a first inductor 171, a second inductor 172, a capacitor 173, and a termination circuit 174. As shown in FIG. 5B, the first inductor 171 and capacitor 173 are electrically connected in parallel with one another. Additionally, the parallel combination of the first inductor 171 and the capacitor 173 are connected in series with the second inductor 172 between the signal port 170 and ground. The termination circuit 174 is also connected between the signal port 170 and ground.

In certain implementations, the notch filter 180 is implemented to provide a notch in frequency in 5G n79. The component values of the notch filter 180 can have a wide variety of values, such as values selected for a particular application and/or implementation. In one example, the first inductor 171 has an inductance of about 1.7 nanohenry (nH), the second inductor 172 has an inductance of about 1.46 nH, the capacitor 173 has a capacitance of about 1.4 picofarad (pF), and the termination circuit 174 has an impedance of about 50 ohm. However, other implementations are possible.

Figure 5C:
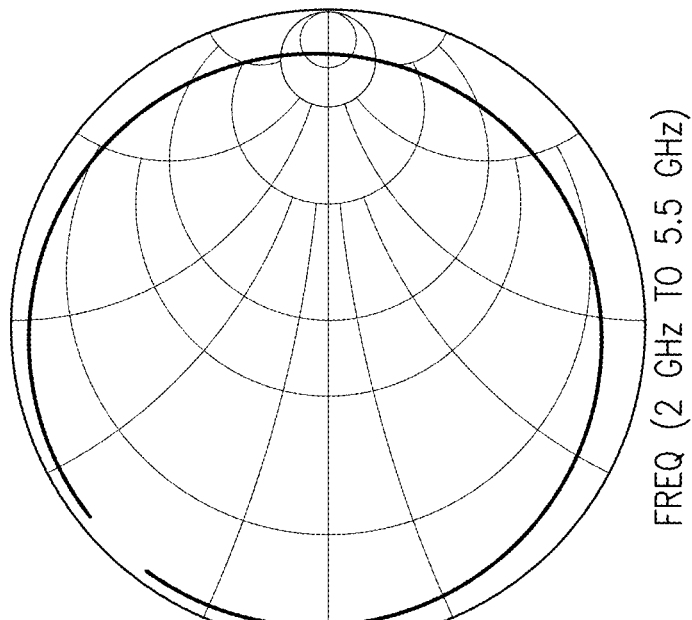
FIG. 5C is a diagram showing one example of simulation results for the RF module of FIG. 5A.
Figure 5C:
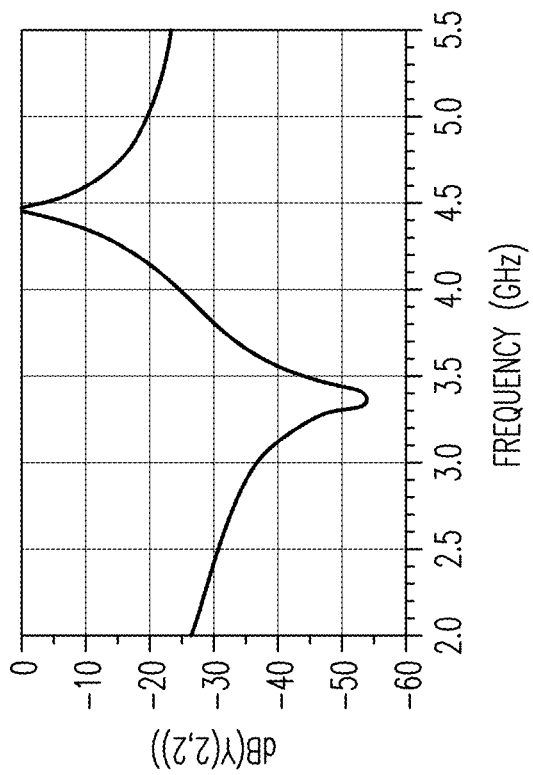

FIG. 5C is a diagram showing one example of simulation results for the RF module 160 of FIG. 5A. The simulations correspond to an implementation of the RF module 160 in which the notch filter 159 in implemented using the notch filter circuit 180 of FIG. 5B. The simulations include a graph of gain versus frequency and a Smith chart of the S-parameter S22.

Figure 6A:
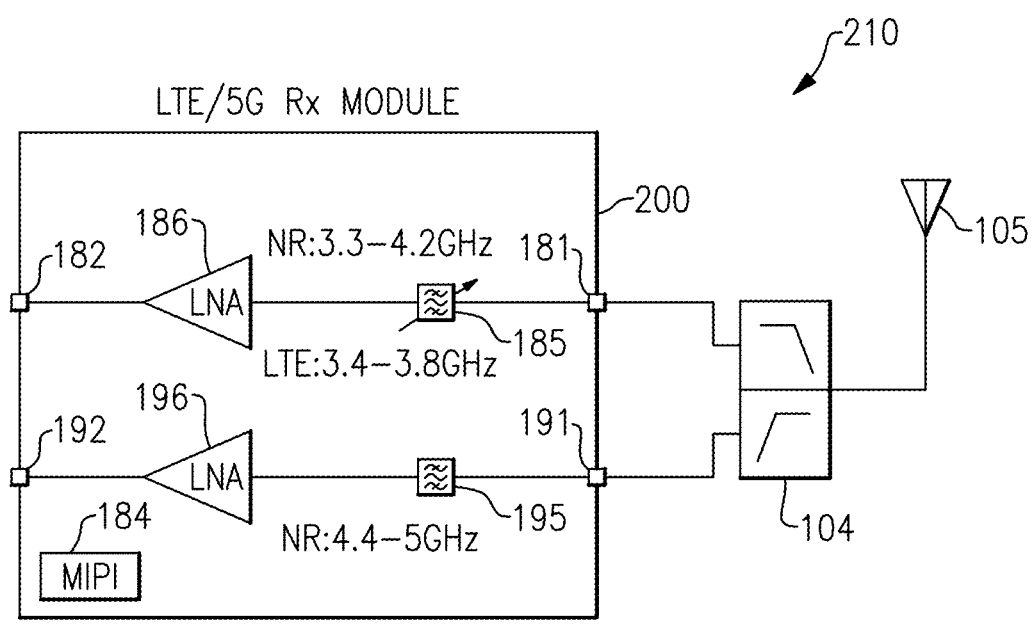
FIG. 6A is a schematic diagram of another embodiment of a front end circuit.

FIG. 6A is a schematic diagram of another embodiment of a front end circuit 210. The front end circuit 210 includes a multi-band RF receive module 200, a diplexer 104, and an antenna 105.

In the illustrated embodiment, the multi-band RF receive module 200 includes a first antenna pin 181, a second antenna pin 191, a first receive output pin 182, a second receive output pin 192, a serial interface 184, a tunable filter 185, a bandpass filter 195, a first LNA 186, and a second LNA 196. Although one embodiment of an RF module is shown, the teachings herein are applicable to RF modules implemented in a wide variety of ways.

In certain implementations herein, multiple RF paths associated with different frequency bands are collocated on a common module. Such a common module can include one or more semiconductor dies.

In the illustrated embodiment, a first RF path processes LTE B42/5G n77, and includes the tunable filter 185 and the first LNA 186. Additionally, a second RF path processes 5G n79, and includes the bandpass filter 195 and the second LNA 196. Thus, the multi-band RF module 210 is a LTE/5G receive module, in this embodiment.

Figure 6B:
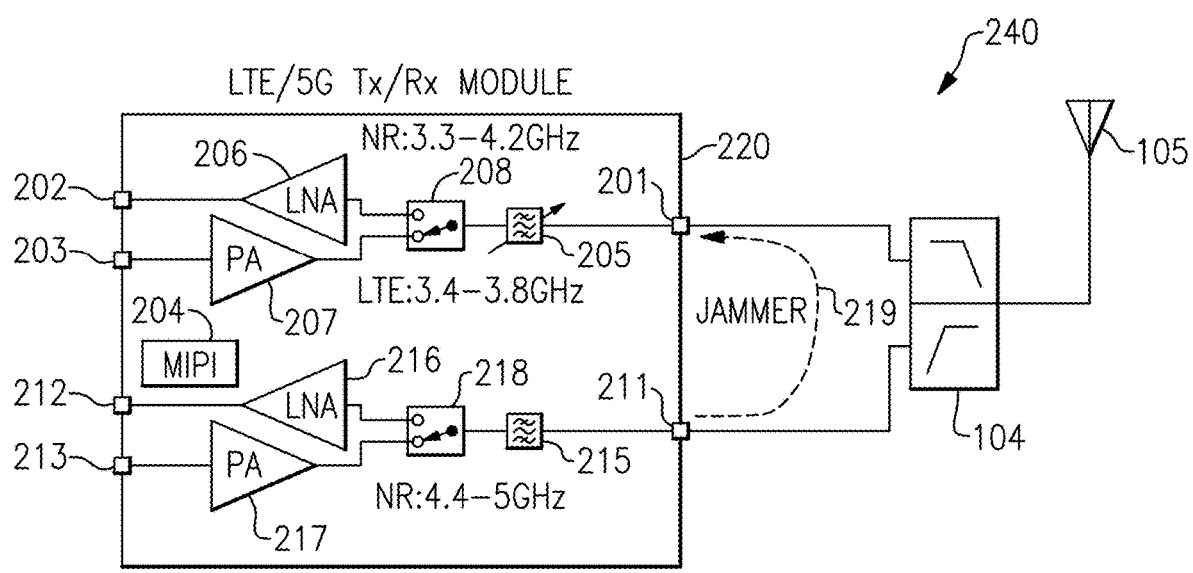
FIG. 6B is a schematic diagram of another embodiment of a front end circuit.

FIG. 6B is a schematic diagram of another embodiment of a front end circuit 240. The front end circuit 240 includes a multi-band RF transmit/receive module 220, a diplexer 104, and an antenna 105. The multi-band RF transmit/receive module 220 illustrates another example of an RF module including multiple RF paths associated with different frequency bands that are collocated on a common module.

In the illustrated embodiment, the multi-band RF transmit/receive module 220 includes a first antenna pin 201, a second antenna pin 211, a first receive output pin 202, a second receive output pin 212, a first transmit input pin 203, a second transmit input pin 213, a serial interface 204, a tunable filter 205, a bandpass filter 215, a first LNA 206, a second LNA 216, a first power amplifier 207, a second power amplifier 217, a first switch 208, and second switch 218. Although one embodiment of an RF module is shown, the teachings herein are applicable to RF modules implemented in a wide variety of ways.

In the illustrated embodiment, a first RF path transmits/receives LTE B42/5G n77, and includes the tunable filter 205 and the first switch 208, which selectively connects the tunable filter 205 to an input of the first LNA 206 or to an output of the first power amplifier 207. Additionally, a second RF path transmits/receives 5G n79, and includes the bandpass filter 215 and the second switch 218, which selectively connects the bandpass filter 215 to an input of the second LNA 216 or to an output of the second power amplifier 217. Thus, the multi-band RF module 220 is a LTE/5G transmit/receive module, in this embodiment.

As shown in FIG. 6B, 5G/LTE jammer coupling 219 can arise through diplexer isolation.

Figure 6C:
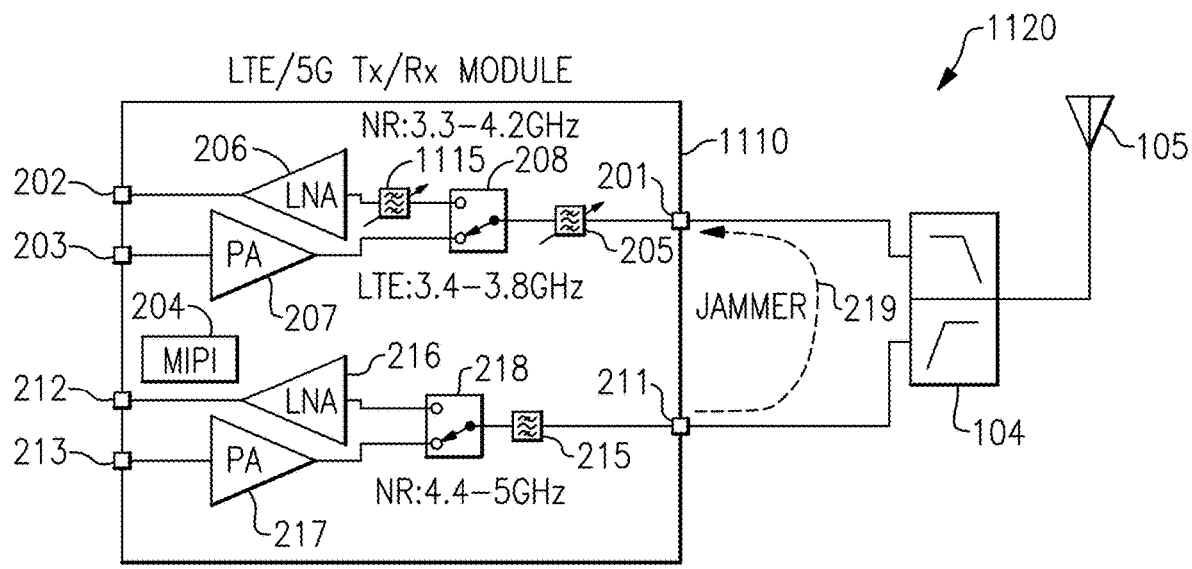
FIG. 6C is a schematic diagram of another embodiment of a front end circuit.

FIG. 6C is a schematic diagram of another embodiment of a front end circuit 1120. The front end circuit 1120 includes a multi-band RF transmit/receive module 1110, a diplexer 104, and an antenna 105.

The front end circuit 1120 of FIG. 6C is similar to the front end circuit 240 of FIG. 6B, except that the front end circuit 1120 includes an implementation of tunable filtering including multiple tunable filters. For example, in comparison to the multi-band RF transmit/receive module 220 of FIG. 6B, the multi-band RF transmit/receive module 1110 of FIG. 6C includes both a first tunable filter 205 between the first antenna pin 201 and the switch 208 and a second tunable filter 1115 between the switch 208 and an input to the LNA 206.

Figure 6D:
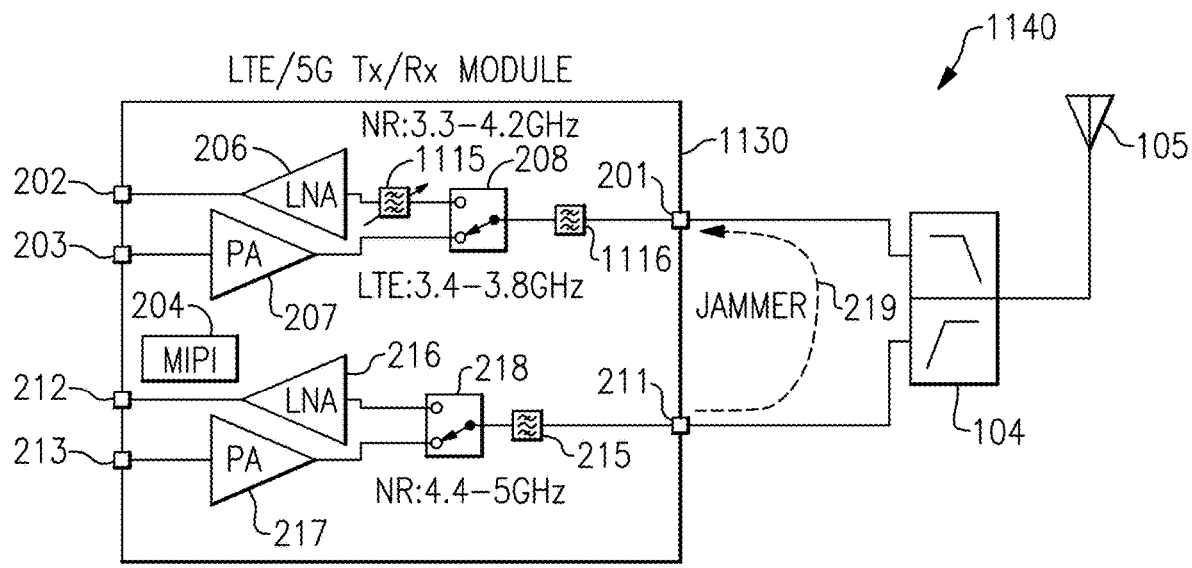
FIG. 6D is a schematic diagram of another embodiment of a front end circuit.

FIG. 6D is a schematic diagram of another embodiment of a front end circuit 1140. The front end circuit 1140 includes a multi-band RF transmit/receive module 1130, a diplexer 104, and an antenna 105.

The front end circuit 1140 of FIG. 6D is similar to the front end circuit 1120 of FIG. 6C, except that the front end circuit 1140 includes an implementation of filtering including a fixed filter and a tunable filter. For example, in comparison to the multi-band RF transmit/receive module 1110 of FIG. 6C that includes two tunable filters, the multi-band RF transmit/receive module 1130 of FIG. 6D includes a tunable filter 1115 between the switch 208 and an input to the LNA 206 and a fixed filter 1116 between the first antenna pin 201 and the switch 208.

Figure 6E:
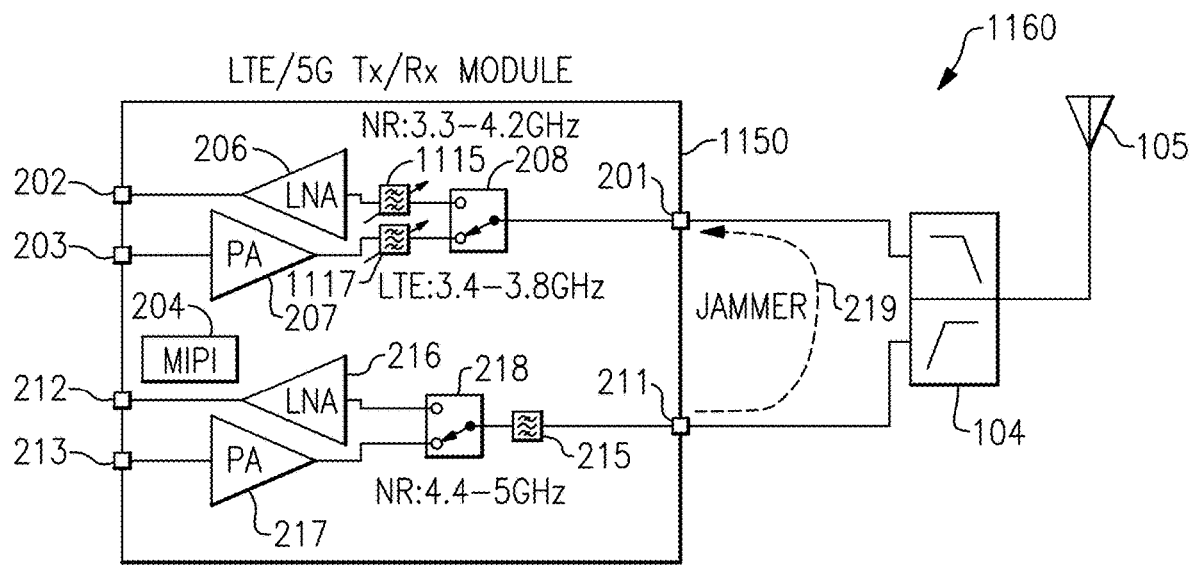
FIG. 6E is a schematic diagram of another embodiment of a front end circuit.

FIG. 6E is a schematic diagram of another embodiment of a front end circuit 1160. The front end circuit 1160 includes a multi-band RF transmit/receive module 1150, a diplexer 104, and an antenna 105.

The front end circuit 1160 of FIG. 6E is similar to the front end circuit 240 of FIG. 6B, except that the front end circuit 1160 includes an implementation of tunable filtering in which separate tunable receive and tunable transmit filters are provided. For example, in comparison to the multi-band RF transmit/receive module 220 of FIG. 6B, the multi-band RF transmit/receive module 1150 of FIG. 6E omits the tunable filter 205 in favor of including a tunable receive filter 1115 between a first throw of the switch 208 and an input to the LNA 206 and a tunable transmit filter 1117 between a second throw of the switch 208 and an output of the power amplifier 207.

Figure 6F:
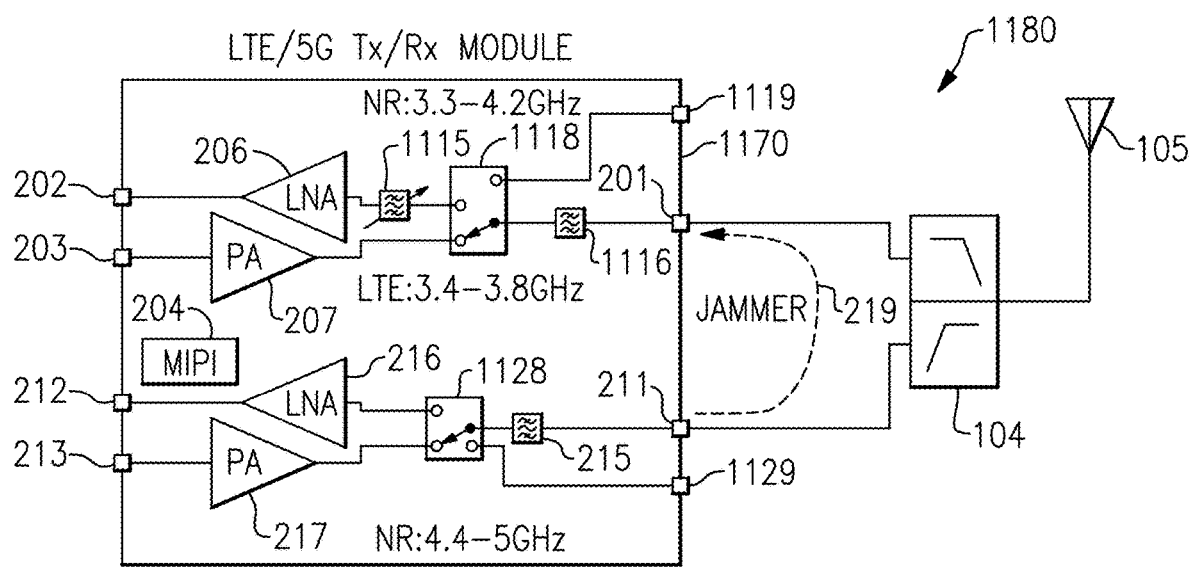
FIG. 6F is a schematic diagram of another embodiment of a front end circuit.

FIG. 6F is a schematic diagram of another embodiment of a front end circuit 1180. The front end circuit 1180 includes a multi-band RF transmit/receive module 1170, a diplexer 104, and an antenna 105.

The front end circuit 1180 of FIG. 6F is similar to the front end circuit 1140 of FIG. 6D, except that the front end circuit 1180 includes an implementation of switches with an additional throw for connecting to bypass terminals. For example, in comparison to the multi-band RF transmit/receive module 1130 of FIG. 6D, the multi-band RF transmit/receive module 1170 of FIG. 6F includes a bypass terminal 1119 and a switch 1118 having a third throw coupled to the bypass terminal 1119 and a switch 1128 having an additional throw coupled to the bypass terminal 1129.

Figure 6G:
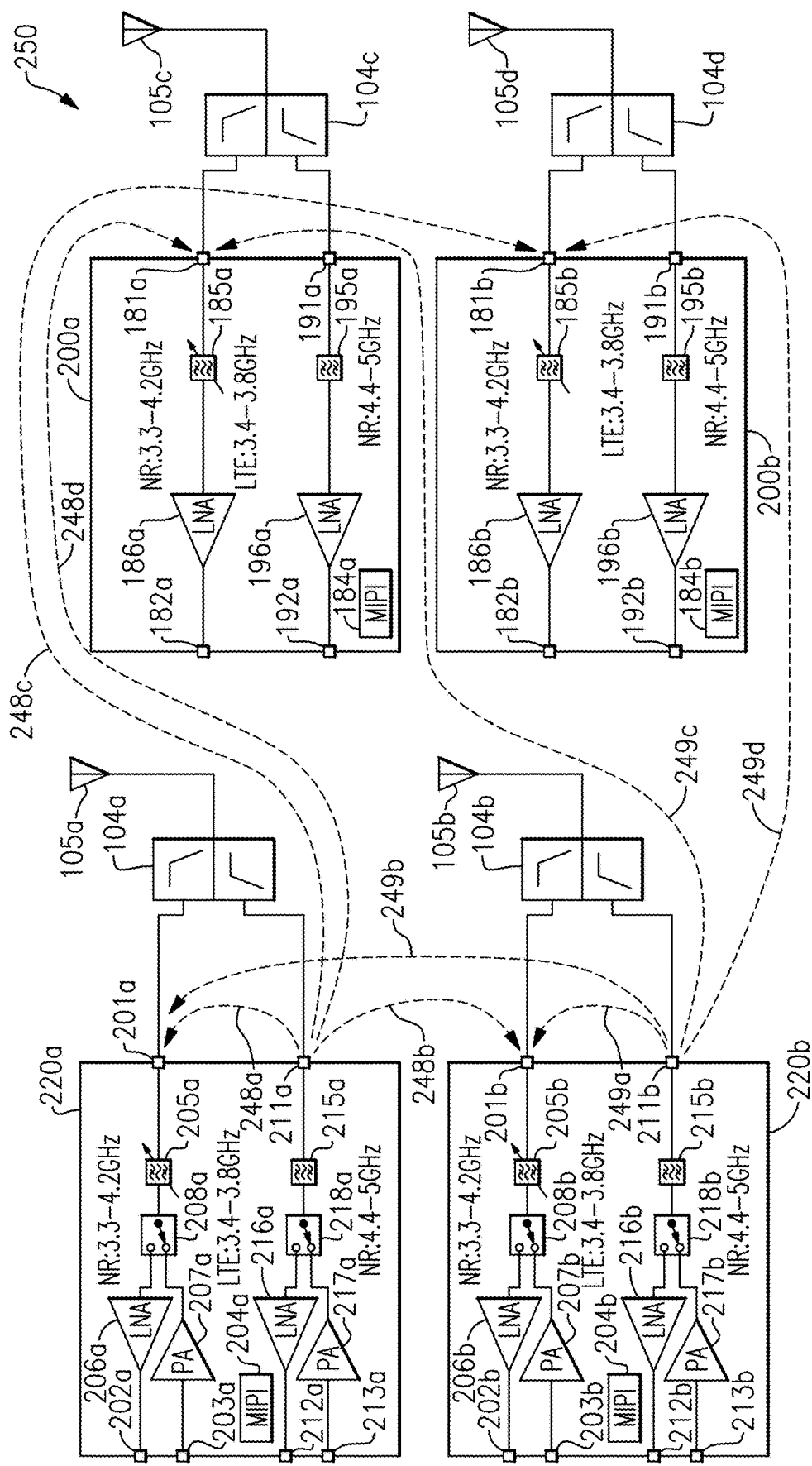
FIG. 6G is a schematic diagram of another embodiment of a front end circuit.

FIG. 6G is a schematic diagram of another embodiment of a front end circuit 250. The front end circuit 250 includes a first multi-band RF transmit/receive module 220a, a first diplexer 104a, a first antenna 105a, a second multi-band RF transmit/receive module 220b, a second diplexer 104b, a second antenna 105b, a first multi-band RF receive module 200a, a third diplexer 104c, a third antenna 105c, a second multi-band RF receive module 200b, a fourth diplexer 104d, and a fourth antenna 105d.

In the illustrated embodiment, the first multi-band RF receive module 200a and the second multi-band RF receive module 200b are implemented as described above with respect to the multi-band RF receive module 200 of FIG. 6A. For example, the first multi-band RF receive module 200a includes a first antenna pin 181a, a second antenna pin 191a, a first receive output pin 182a, a second receive output pin 192a, a serial interface 184a, a tunable filter 185a, a bandpass filter 195a, a first LNA 186a, and a second LNA 196a. Additionally, the second multi-band RF receive module 200b includes a first antenna pin 181b, a second antenna pin 191b, a first receive output pin 182b, a second receive output pin 192b, a serial interface 184b, a tunable filter 185b, a bandpass filter 195b, a first LNA 186b, and a second LNA 196b.

With continuing reference to FIG. 6G, the first multi-band RF transmit/receive module 220a and the second multi-band RF transmit/receive module 220b are implemented as described above with respect to the multi-band RF transmit/receive module 220 of FIG. 6B. For example, the first multi-band RF transmit/receive module 220a includes a first antenna pin 201a, a second antenna pin 211a, a first receive output pin 202a, a second receive output pin 212a, a first transmit input pin 203a, a second transmit input pin 213a, a serial interface 204a, a tunable filter 205a, a bandpass filter 215a, a first LNA 206a, a second LNA 216a, a first power amplifier 207a, a second power amplifier 217a, a first switch 208a, and second switch 218a. Additionally, the second multi-band RF transmit/receive module 220b includes a first antenna pin 201b, a second antenna pin 211b, a first receive output pin 202b, a second receive output pin 212b, a first transmit input pin 203b, a second transmit input pin 213b, a serial interface 204b, a tunable filter 205b, a bandpass filter 215b, a first LNA 206b, a second LNA 216b, a first power amplifier 207b, a second power amplifier 217b, a first switch 208b, and second switch 218b.

In the illustrated embodiment, the front end circuit 250 is implemented to operate with n77/B42 4×4 DL MIMO and n79 2×2 UL MIMO. The teachings herein are applicable to RF systems operating using DL MIMO and/or UL MIMO of a wide variety of orders.

As shown in FIG. 6G, various jammers can be present when using MIMO. For example, when the power amplifier 217a is transmitting, a first jammer signal 248a can reach the antenna pin 201a of the module 220a, a second jammer signal 248b can reach the antenna pin 201b of the module 220b, a third jammer signal 248c can reach the antenna pin 181b of the module 200b, and a fourth jammer signal 248d can reach the antenna pin 181a of the module 200a. Additionally, when the power amplifier 217b is transmitting, a first jammer signal 249a can reach the antenna pin 201b of the module 220b, a second jammer signal 249b can reach the antenna pin 201a of the module 220a, a third jammer signal 249c can reach the antenna pin 181a of the module 200a, and a fourth jammer signal 249d can reach the antenna pin 181b of the module 200b.

Figure 6H:
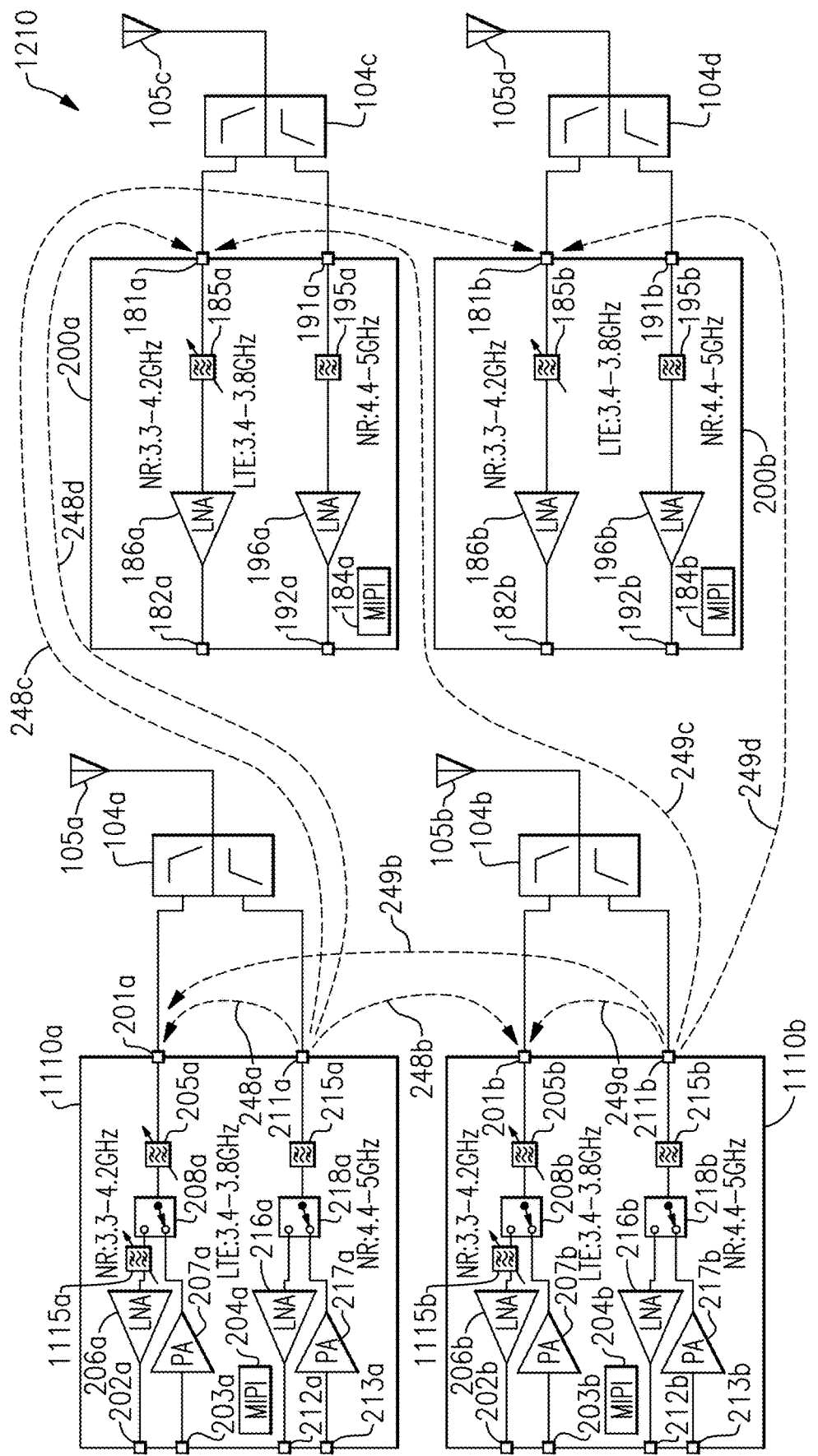
FIG. 6H is a schematic diagram of another embodiment of a front end circuit.

FIG. 6H is a schematic diagram of another embodiment of a front end circuit 1210. The front end circuit 1210 of FIG. 6H is similar to the front end circuit 250 of FIG. 6G, except that the front end circuit 1210 omits the first multi-band RF transmit/receive module 220a and the second multi-band RF transmit/receive module 220b in favor of including a first multi-band RF transmit/receive module 1110a and a second multi-band RF transmit/receive module 1110b. The first multi-band RF transmit/receive module 1110a and the second multi-band RF transmit/receive module 1110b are implemented in accordance with the multi-band RF transmit/receive module 1110 of FIG. 6C.

Figure 6I:
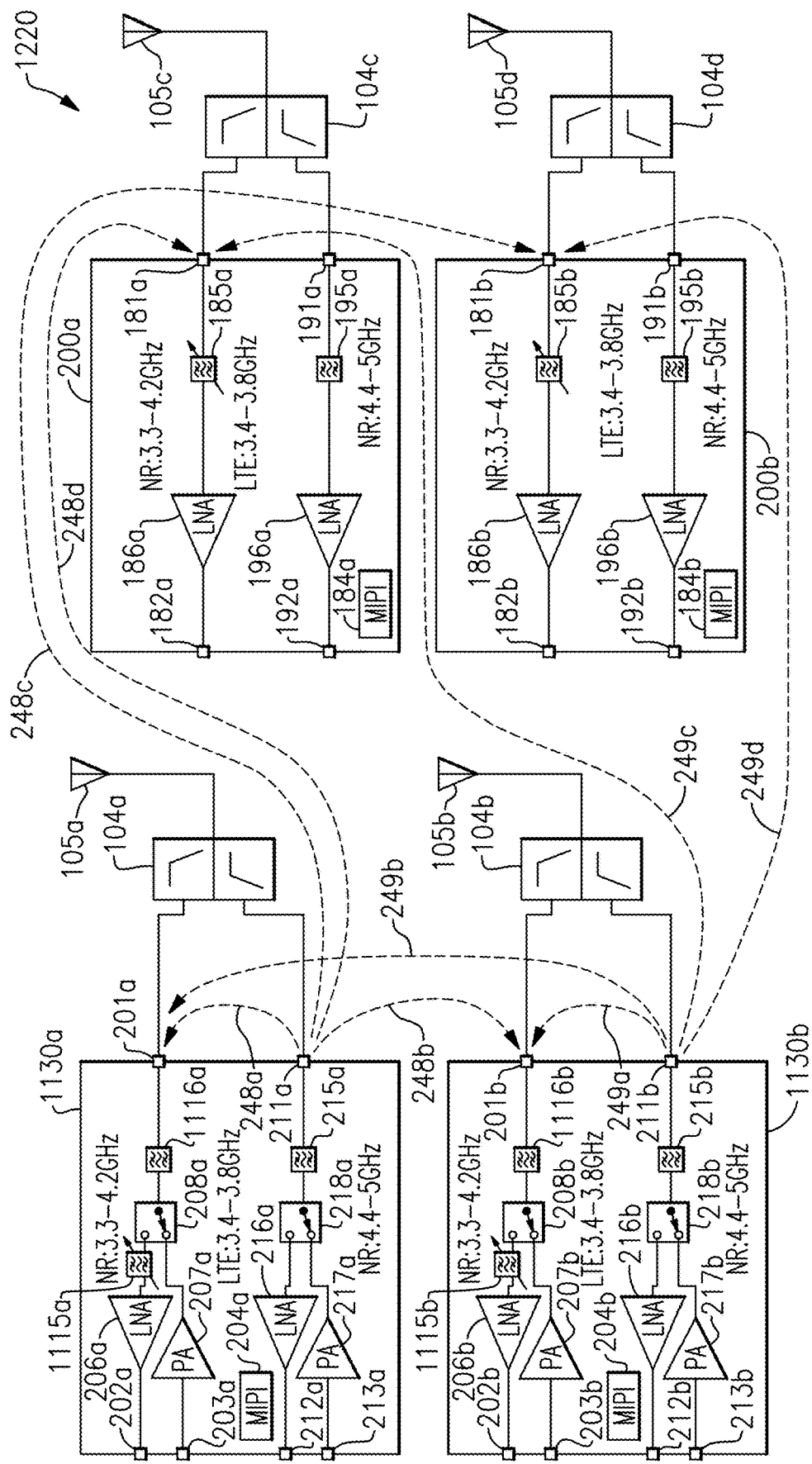
FIG. 6I is a schematic diagram of another embodiment of a front end circuit.

FIG. 6I is a schematic diagram of another embodiment of a front end circuit 1220. The front end circuit 1220 of FIG. 6I is similar to the front end circuit 250 of FIG. 6G, except that the front end circuit 1220 omits the first multi-band RF transmit/receive module 220a and the second multi-band RF transmit/receive module 220b in favor of including a first multi-band RF transmit/receive module 1130a and a second multi-band RF transmit/receive module 1130b. The first multi-band RF transmit/receive module 1130a and the second multi-band RF transmit/receive module 1130b are implemented in accordance with the multi-band RF transmit/receive module 1130 of FIG. 6D.

Figure 6J:
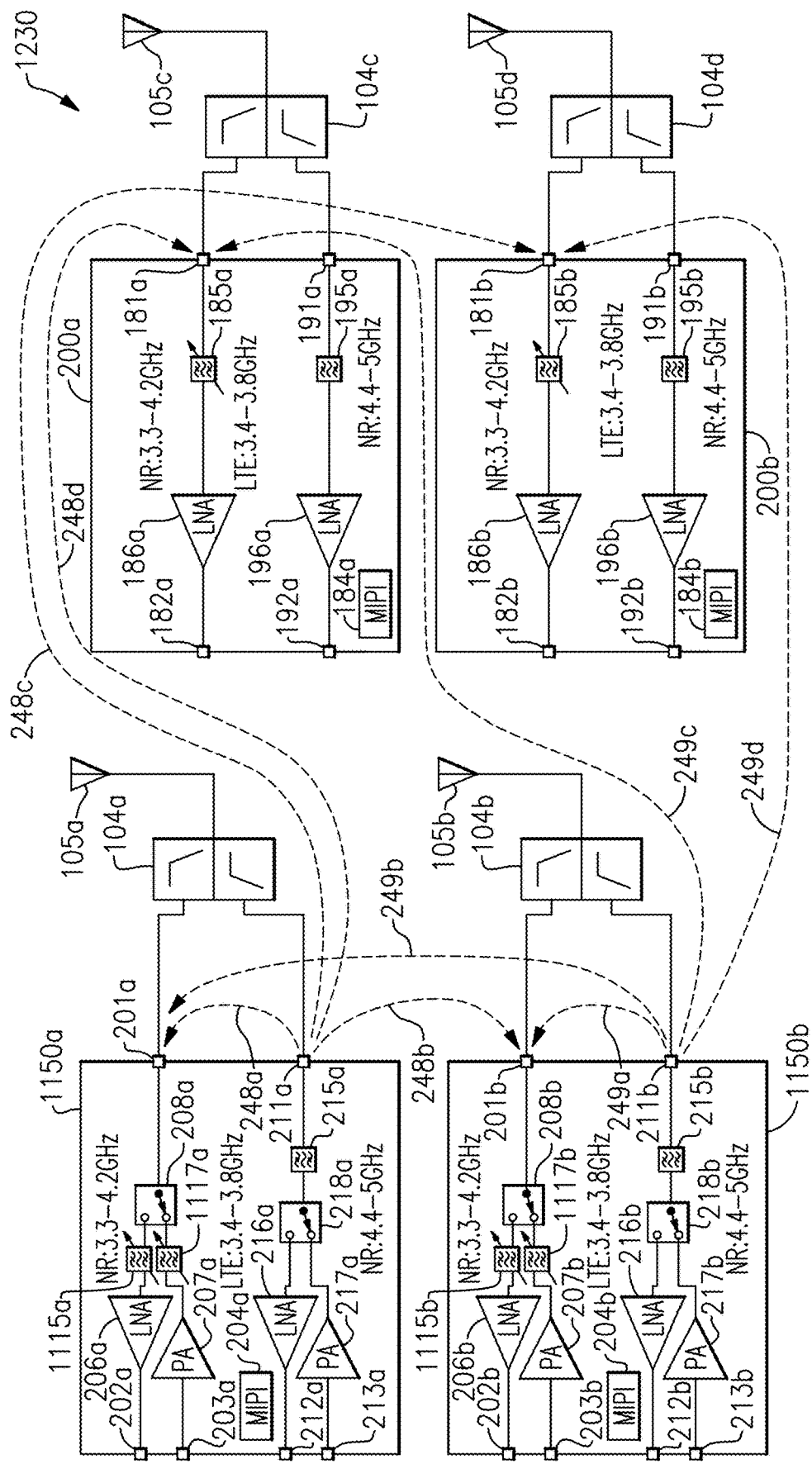
FIG. 6J is a schematic diagram of another embodiment of a front end circuit.

FIG. 6J is a schematic diagram of another embodiment of a front end circuit 1230. The front end circuit 1230 of FIG. 6J is similar to the front end circuit 250 of FIG. 6G, except that the front end circuit 1230 omits the first multi-band RF transmit/receive module 220a and the second multi-band RF transmit/receive module 220b in favor of including a first multi-band RF transmit/receive module 1150a and a second multi-band RF transmit/receive module 1150b. The first multi-band RF transmit/receive module 1150a and the second multi-band RF transmit/receive module 1150b are implemented in accordance with the multi-band RF transmit/receive module 1150 of FIG. 6E.

Figure 6K:
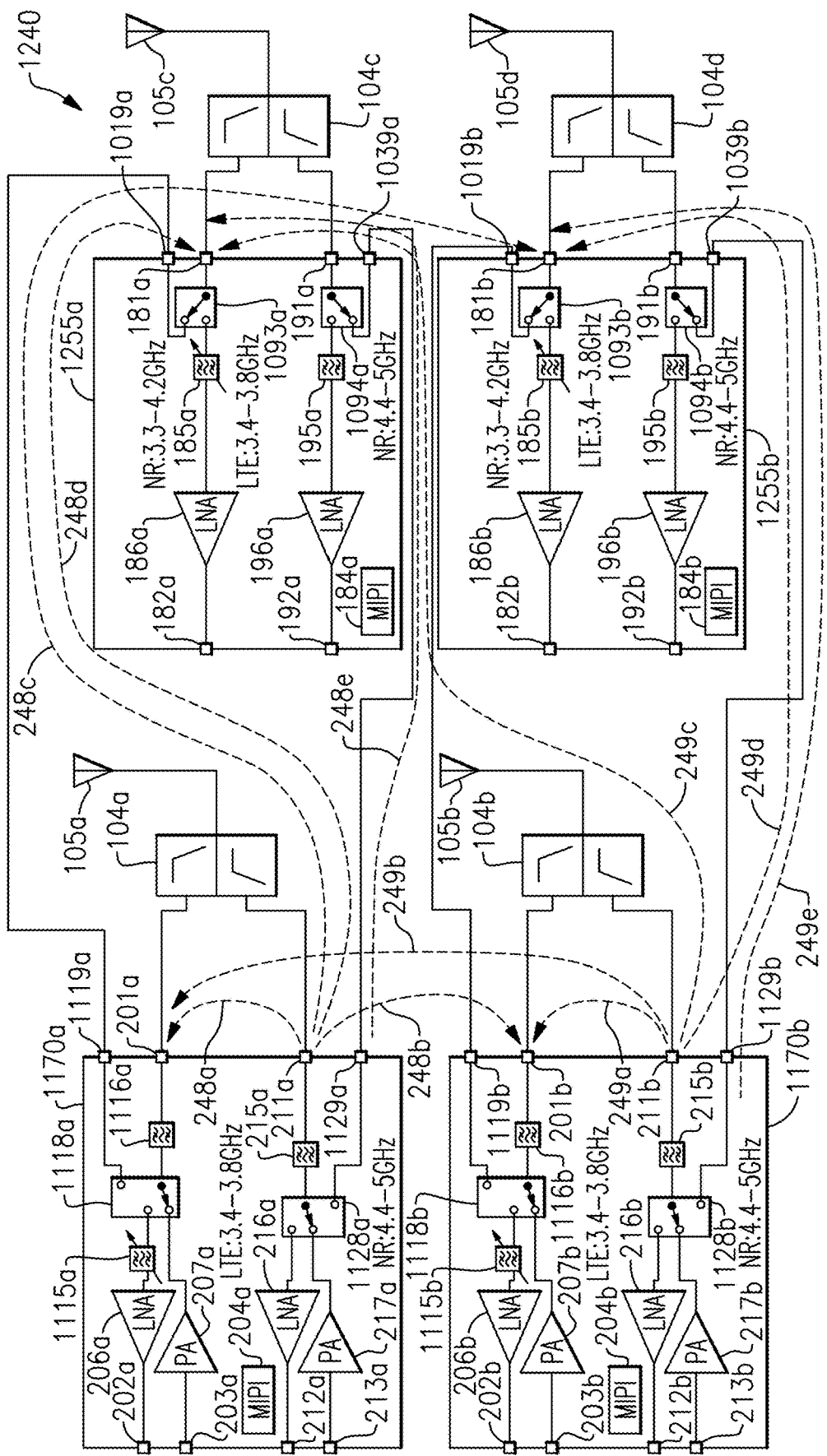
FIG. 6K is a schematic diagram of another embodiment of a front end circuit.

FIG. 6K is a schematic diagram of another embodiment of a front end circuit 1240.

The front end circuit 1240 of FIG. 6K is similar to the front end circuit 250 of FIG. 6G, except that the front end circuit 1240 omits the first multi-band RF transmit/receive module 220a and the second multi-band RF transmit/receive module 220b in favor of including a first multi-band RF transmit/receive module 1170a and a second multi-band RF transmit/receive module 1170b. The first multi-band RF transmit/receive module 1170a and the second multi-band RF transmit/receive module 1170b are implemented in accordance with the multi-band RF transmit/receive module 1170 of FIG. 6F.

Furthermore, the front end circuit 1240 of FIG. 6K omits the first multi-band RF receive module 200a and the second multi-band RF receive module 200b of FIG. 6G in favor of including a first multi-band RF receive module 1255a and a second multi-band RF receive module 1255b. The first multi-band RF receive module 1255a of FIG. 6K is similar to the first multi-band RF receive module 200a of FIG. 6G, except that the first multi-band RF receive module 1255a further includes a switch 1093a, a switch 1094a, a bypass terminal 1019a, and a bypass terminal 1039a. Additionally, the second multi-band RF receive module 1255b of FIG. 6K is similar to the second multi-band RF receive module 200b of FIG. 6G, except that the second multi-band RF receive module 1255b further includes a switch 1093b, a switch 1094b, a bypass terminal 1019b, and a bypass terminal 1039b.

As shown in FIG. 6K, the bypass terminal 1119a of the first multi-band RF transmit/receive module 1170a is electrically connected to the bypass terminal 1019a of the first multi-band RF receive module 1255a, and the bypass terminal 1129a of the first multi-band RF transmit/receive module 1170a is electrically connected to the bypass terminal 1039a of the first multi-band RF receive module 1255a. Additionally, the bypass terminal 1119b of the second multi-band RF transmit/receive module 1170b is electrically connected to the bypass terminal 1019b of the second multi-band RF receive module 1255b, and the bypass terminal 1129b of the second multi-band RF transmit/receive module 1170b is electrically connected to the bypass terminal 1039b of the second multi-band RF receive module 1255b.

Implementing the front end circuit 1240 in this manner provides the ability to route any transmit signal to any of the four antennas for sounding the RF propagation channel of each antenna path to improve MIMO performance.

As shown in FIG. 6K, various jammers can be present when using MIMO. For example, when the power amplifier 217a is transmitting, a first jammer signal 248a can reach the antenna pin 201a of the module 1170a, a second jammer signal 248b can reach the antenna pin 201b of the module 1170b, a third jammer signal 248c can reach the antenna pin 181*b* of the module 1255*b*, and a fourth jammer signal 248*d* can reach the antenna pin 181*a* of the module 1255*a*. Furthermore, inclusion of the bypass terminal 1129*a* on the module 1170*a* gives rise to a fifth jammer signal 248*e* that can reach the antenna pin 181*a* of the module 1255*a*. Additionally, when the power amplifier 217*b* is transmitting, a first jammer signal 249*a* can reach the antenna pin 201*b* of the module 1170*b*, a second jammer signal 249*b* can reach the antenna pin 201*a* of the module 1170*a*, a third jammer signal 249*c* can reach the antenna pin 181*a* of the module 1255*a*, and a fourth jammer signal 249*d* can reach the antenna pin 181*b* of the module 1255*b*. Furthermore, inclusion of the bypass terminal 1129*b* on the module 1170*b* gives rise to a fifth jammer signal 249*e* that can reach the antenna pin 181*b* of the module 1255*b*.

Figure 7A:
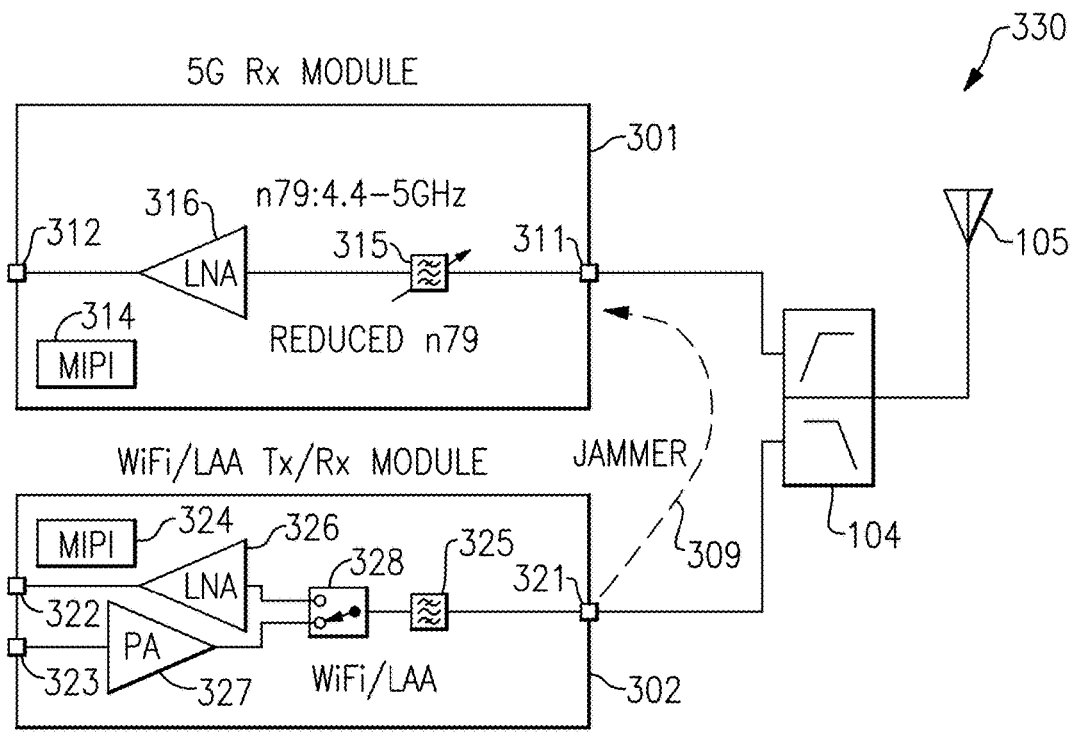
FIG. 7A is a schematic diagram of another embodiment of a front end circuit.

FIG. 7A is a schematic diagram of another embodiment of a front end circuit 330. The front end circuit 330 includes a 5G receive module 301, a WiFi/LAA transmit/receive module 302, a diplexer 104, and an antenna 105.

In the illustrated embodiment, the 5G receive module 301 includes an antenna pin 311, a receive output pin 312, a serial interface 314, a tunable filter 315, and an LNA 316. Additionally, the WiFi/LAA transmit/receive module 302 includes an antenna pin 321, a receive output pin 322, a transmit input pin 323, a serial interface 324, a bandpass filter 325, an LNA 326, a power amplifier 327, and a switch 328.

Although various example implementations of the modules are shown, the teachings herein are applicable to other implementations of modules, including, for example, configurations including more or fewer components and/or a different arrangement of components.

The front end circuit 330 illustrates one embodiment of a front end circuit in which a 5G receive module includes a tunable filter for providing blocker suppression to a jammer signal 309 from a WiFi/LAA module.

Figure 7B:
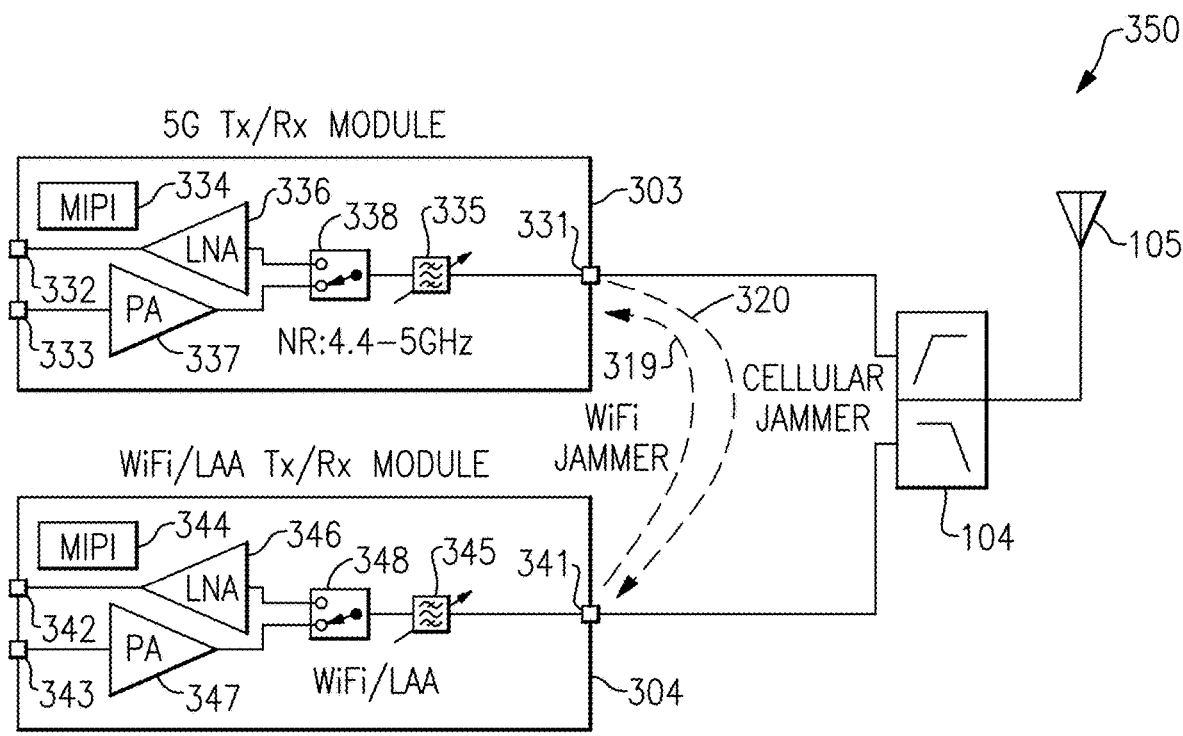
FIG. 7B is a schematic diagram of another embodiment of a front end circuit.

FIG. 7B is a schematic diagram of another embodiment of a front end circuit 350. The front end circuit 350 includes a 5G transmit/receive module 303, a WiFi/LAA transmit/receive module 304, a diplexer 104, and an antenna 105.

In the illustrated embodiment, the 5G transmit/receive module 303 includes an antenna pin 331, a receive output pin 332, a transmit input pin 333, a serial interface 334, a tunable filter 335, an LNA 336, a power amplifier 337, and a switch 338. Additionally, the WiFi/LAA transmit/receive module 304 includes an antenna pin 341, a receive output pin 342, a transmit input pin 343, a serial interface 344, a tunable filter 345, an LNA 346, a power amplifier 347, and a switch 348.

Although various example implementations of the modules are shown, the teachings herein are applicable to other implementations of modules, including, for example, configurations including more or fewer components and/or a different arrangement of components.

The front end circuit 350 illustrates one embodiment of a front end circuit in which a 5G transmit/receive module includes a tunable filter for providing blocker suppression to a jammer signal 319 from a WiFi/LAA module, and in which a WiFi/LAA module includes a tunable filter for providing blocker suppression to a jammer signal 320 from the 5G transmit/receive module.

Figure 7C:
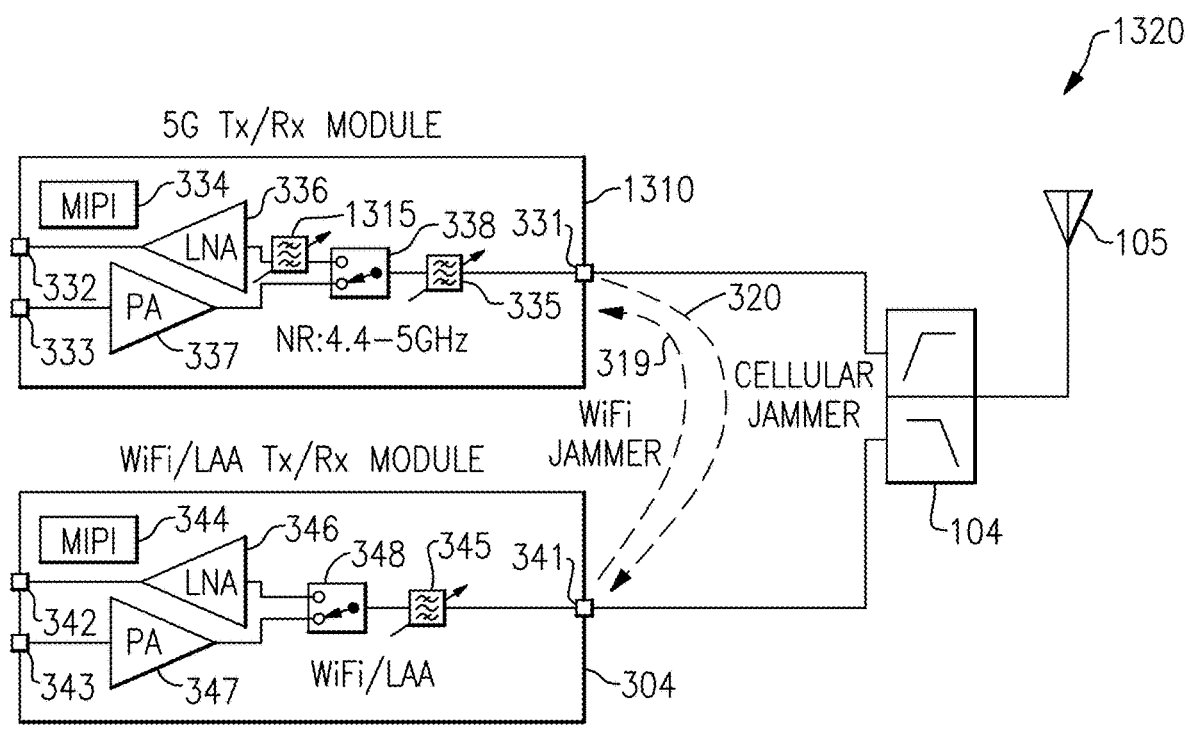
FIG. 7C is a schematic diagram of another embodiment of a front end circuit.

FIG. 7C is a schematic diagram of another embodiment of a front end circuit 1320. The front end circuit 1320 includes a 5G transmit/receive module 1310, a WiFi/LAA transmit/receive module 304, a diplexer 104, and an antenna 105.

The front end circuit 1320 of FIG. 7C is similar to the front end circuit 350 of FIG. 7B, except that the front end circuit 1320 includes an implementation of 5G transmit/receive tunable filtering including multiple tunable filters. For example, in comparison to the 5G transmit/receive module 303 of FIG. 7B, the 5G transmit/receive module 1310 of FIG. 7C includes both a first tunable filter 335 between the antenna pin 331 and the switch 338 and a second tunable filter 1315 between the switch 338 and an input to the LNA 336.

Figure 7D:
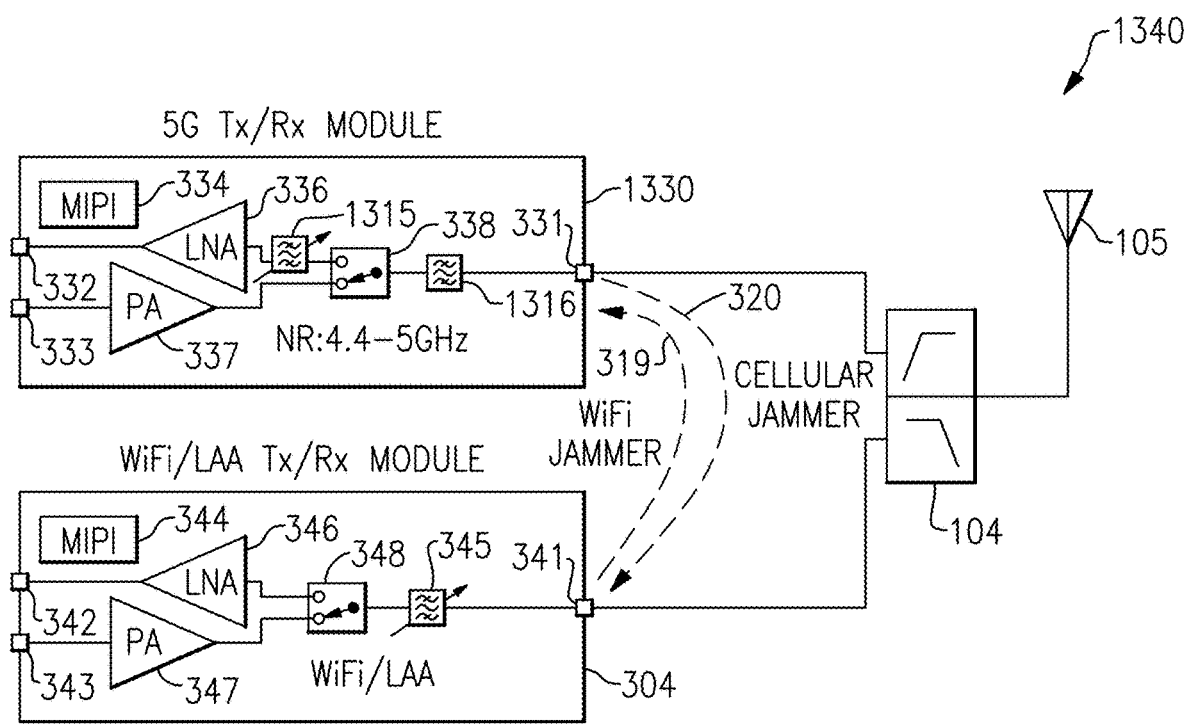
FIG. 7D is a schematic diagram of another embodiment of a front end circuit.

FIG. 7D is a schematic diagram of another embodiment of a front end circuit 1340. The front end circuit 1340 includes a 5G transmit/receive module 1330, a WiFi/LAA transmit/receive module 304, a diplexer 104, and an antenna 105.

The front end circuit 1340 of FIG. 7D is similar to the front end circuit 1320 of FIG. 7C, except that the front end circuit 1340 includes an implementation of 5G transmit/receive filtering including a fixed filter and a tunable filter. For example, in comparison to 5G transmit/receive module 1310 of FIG. 7C that includes two tunable filters, the 5G transmit/receive module 1330 of FIG. 7D includes a tunable filter 1315 between the switch 338 and an input to the LNA 336 and a fixed filter 1316 between the antenna pin 331 and the switch 338.

Figure 7E:
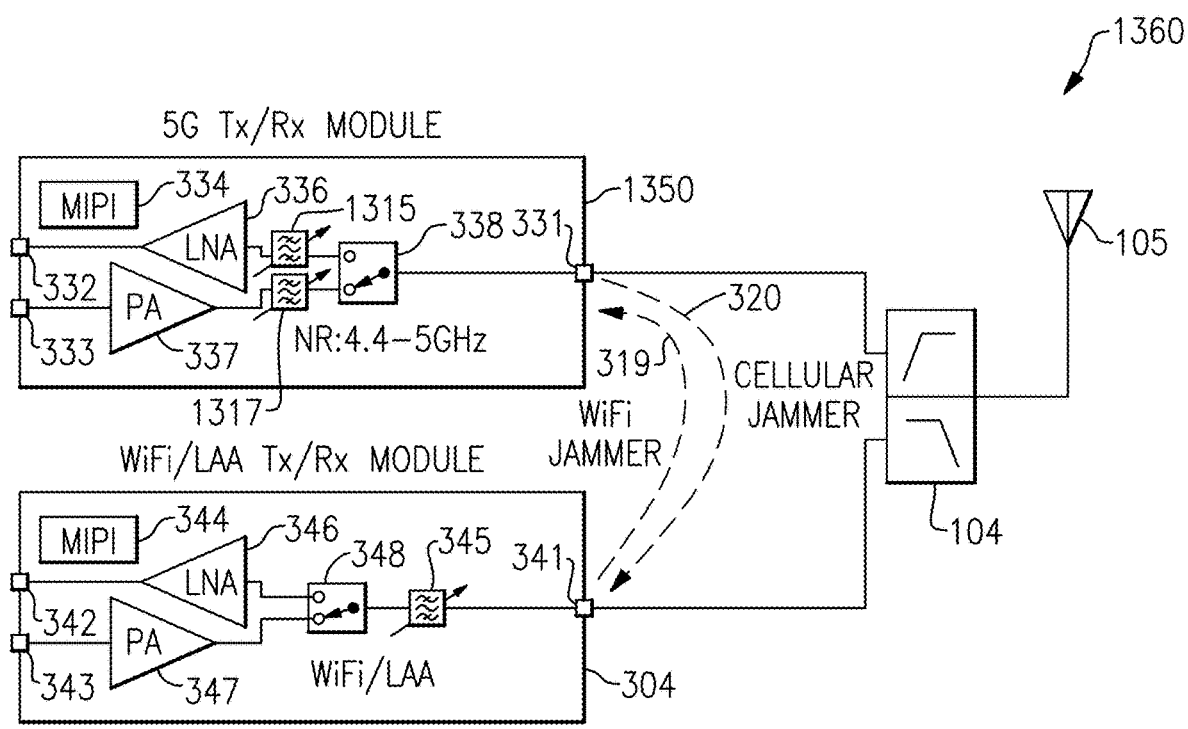
FIG. 7E is a schematic diagram of another embodiment of a front end circuit.

FIG. 7E is a schematic diagram of another embodiment of a front end circuit 1360. The front end circuit 1360 includes a 5G transmit/receive module 1350, a WiFi/LAA transmit/receive module 304, a diplexer 104, and an antenna 105.

The front end circuit 1360 of FIG. 7E is similar to the front end circuit 350 of FIG. 7B, except that the front end circuit 1360 includes an implementation of 5G transmit/receive tunable filtering in which separate tunable receive and tunable transmit filters are provided. For example, in comparison to the 5G transmit/receive module 303 of FIG. 7B, the 5G transmit/receive module 1350 of FIG. 7E omits the tunable filter 335 in favor of including a tunable receive filter 1315 between a first throw of the switch 338 and an input to the LNA 336 and a tunable transmit filter 1317 between a second throw of the switch 338 and an output of the power amplifier 337.

Figure 7F:
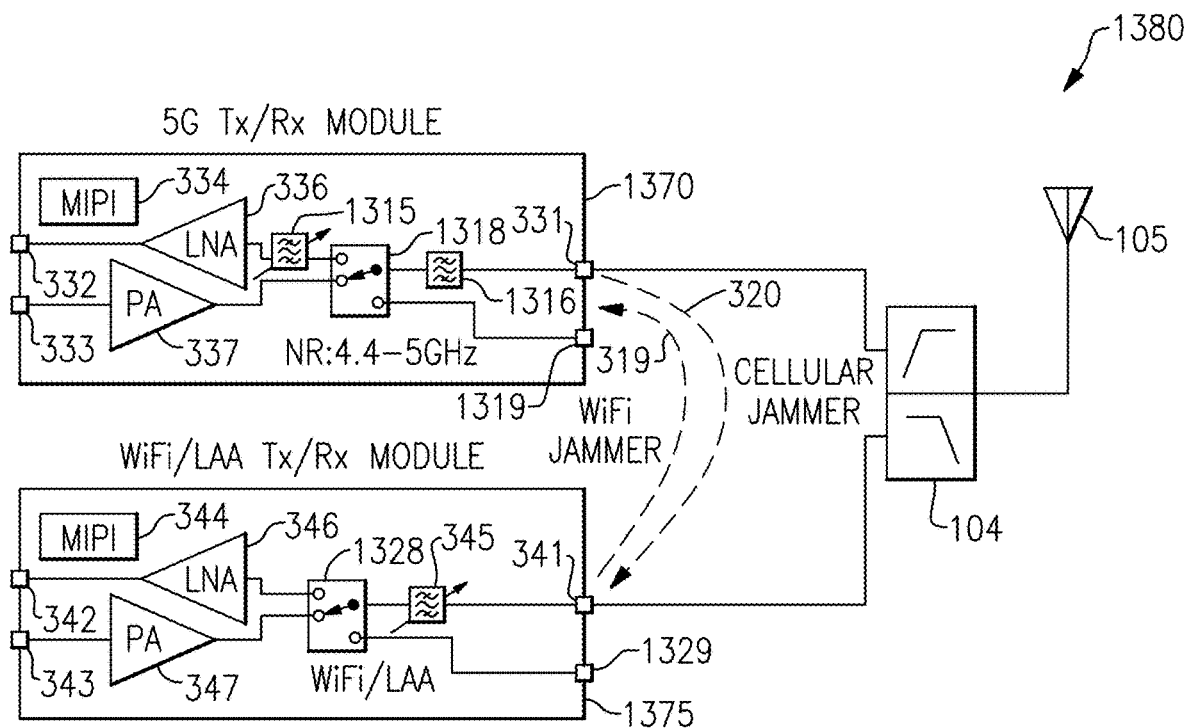
FIG. 7F is a schematic diagram of another embodiment of a front end circuit.

FIG. 7F is a schematic diagram of another embodiment of a front end circuit 1380. The front end circuit 1380 includes a 5G transmit/receive module 1370, a WiFi/LAA transmit/receive module 1375, a diplexer 104, and an antenna 105.

The front end circuit 1380 of FIG. 7F is similar to the front end circuit 1340 of FIG. 7D, except that the front end circuit 1380 includes an implementation of switches with an additional throw for connecting to bypass terminals. For example, in comparison to the 5G transmit/receive module 1330 of FIG. 7D, the 5G transmit/receive module 1370 of FIG. 7F includes a bypass terminal 1319 and a switch 1318 having a third throw coupled to the bypass terminal 1319. Additionally, in comparison to the WiFi/LAA transmit/receive module 304 of FIG. 7D, the WiFi/LAA transmit/receive module 1375 of FIG. 7F includes a bypass terminal 1329 and a switch 1328 having an additional throw coupled to the bypass terminal 1329.

Figure 7G:
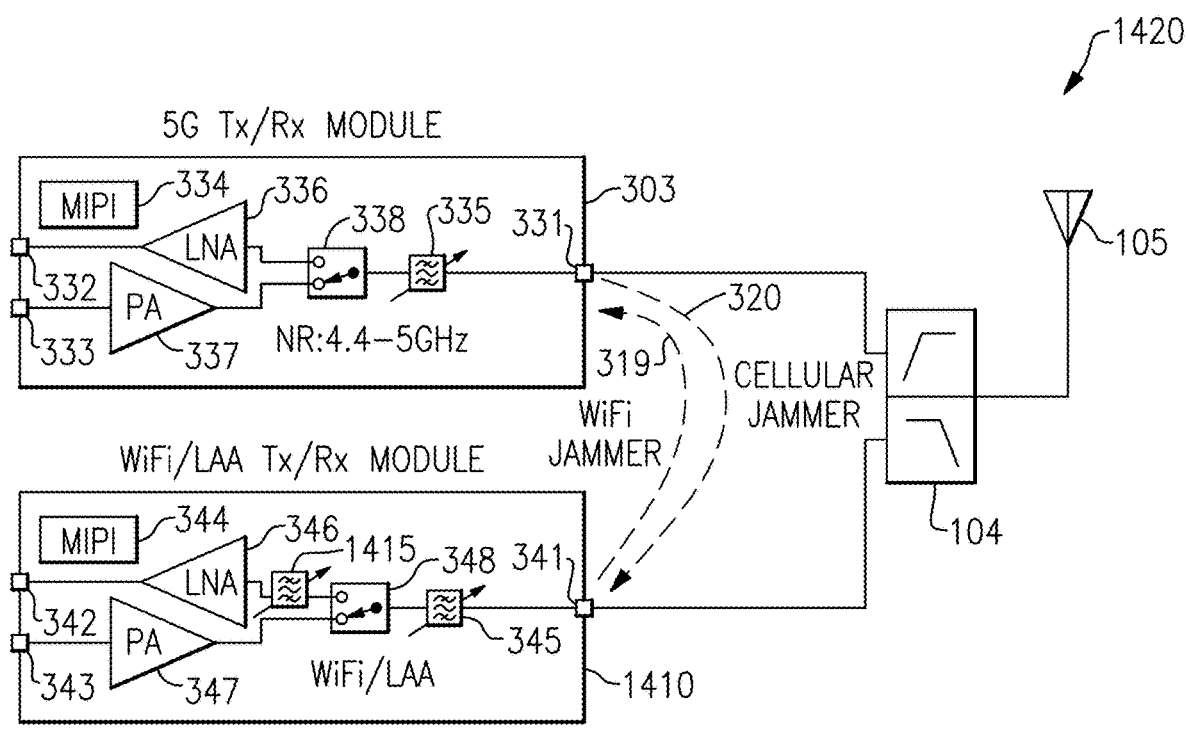
FIG. 7G is a schematic diagram of another embodiment of a front end circuit.

FIG. 7G is a schematic diagram of another embodiment of a front end circuit 1420. The front end circuit 1420 includes a 5G transmit/receive module 303, a WiFi/LAA transmit/receive module 1410, a diplexer 104, and an antenna 105.

The front end circuit 1420 of FIG. 7G is similar to the front end circuit 350 of FIG. 7B, except that the front end circuit 1420 includes an implementation of WiFi/LAA tunable filtering including multiple tunable filters. For example, in comparison to the WiFi/LAA transmit/receive module 304 of FIG. 7B, the WiFi/LAA transmit/receive module 1410 of FIG. 7G includes both a first tunable filter 345 between the antenna pin 341 and the switch 348 and a second tunable filter 1415 between the switch 348 and an input to the LNA 346.

The illustrated front end circuit 1420 of FIG. 7G includes the 5G transmit/receive module 303 of FIG. 7B. However, the 5G transmit/receive module can be implemented in a wide variety of ways, including, but not limited to, using any of the embodiments of FIGS. 7C-7F.

Figure 7H:
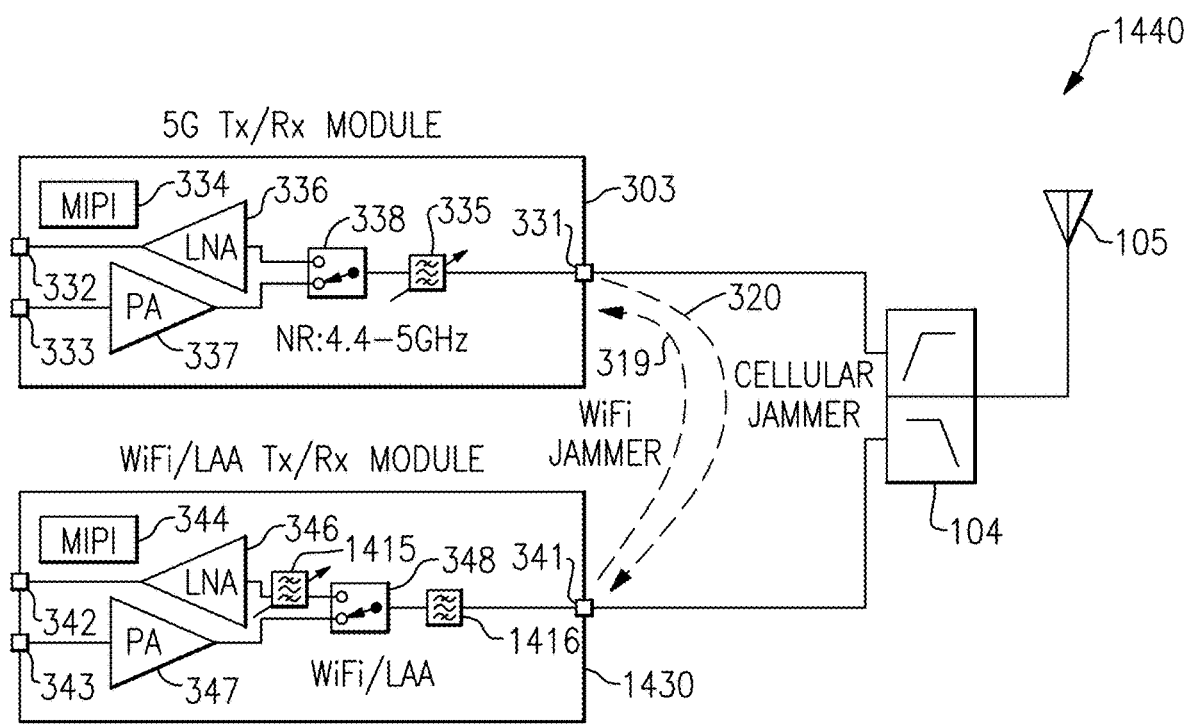
FIG. 7H is a schematic diagram of another embodiment of a front end circuit.

FIG. 7H is a schematic diagram of another embodiment of a front end circuit 1440. The front end circuit 1440 includes a 5G transmit/receive module 303, a WiFi/LAA transmit/receive module 1430, a diplexer 104, and an antenna 105.

The front end circuit 1440 of FIG. 7H is similar to the front end circuit 1420 of FIG. 7G, except that the front end circuit 1440 includes an implementation of WiFi/LAA filtering including a fixed filter and a tunable filter. For example, in comparison to WiFi/LAA transmit/receive module 1410 of FIG. 7G that includes two tunable filters, the WiFi/LAA transmit/receive module 1430 of FIG. 7H includes a tunable filter 1415 between the switch 348 and an input to the LNA 346 and a fixed filter 1416 between the antenna pin 341 and the switch 348.

The illustrated front end circuit 1440 of FIG. 7H includes the 5G transmit/receive module 303 of FIG. 7B. However, the 5G transmit/receive module can be implemented in a wide variety of ways, including, but not limited to, using any of the embodiments of FIGS. 7C-7F.

Figure 7I:
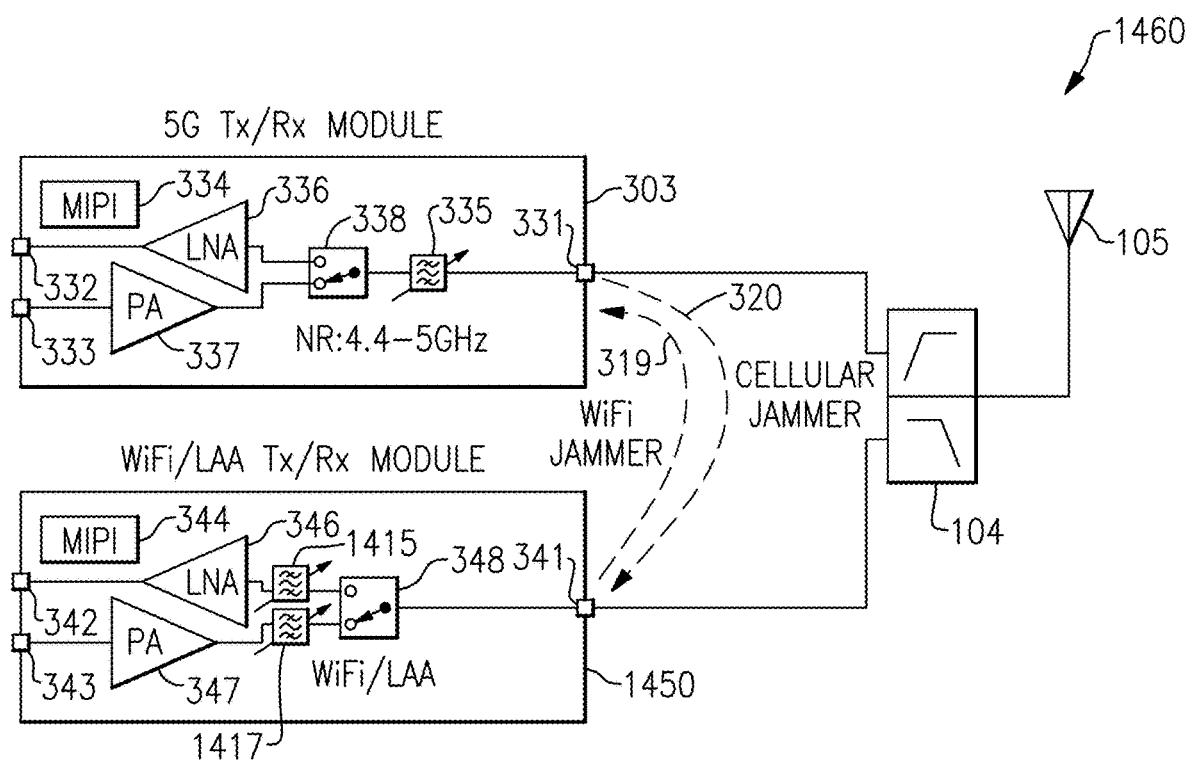
FIG. 7I is a schematic diagram of another embodiment of a front end circuit.

FIG. 7I is a schematic diagram of another embodiment of a front end circuit 1460. The front end circuit 1460 includes a 5G transmit/receive module 303, a WiFi/LAA transmit/receive module 1450, a diplexer 104, and an antenna 105.

The front end circuit 1460 of FIG. 7I is similar to the front end circuit 350 of FIG. 7B, except that the front end circuit 1460 includes an implementation of WiFi/LAA tunable filtering in which separate tunable receive and tunable transmit filters are provided. For example, in comparison to the WiFi/LAA transmit/receive module 304 of FIG. 7B, the WiFi/LAA transmit/receive module 1450 of FIG. 7I omits the tunable filter 345 in favor of including a tunable receive filter 1415 between a first throw of the switch 348 and an input to the LNA 346 and a tunable transmit filter 1417 between a second throw of the switch 348 and an output of the power amplifier 347.

The illustrated front end circuit 1460 of FIG. 7I includes the 5G transmit/receive module 303 of FIG. 7B. However, the 5G transmit/receive module can be implemented in a wide variety of ways, including, but not limited to, using any of the embodiments of FIGS. 7C-7F.

Figure 7J:
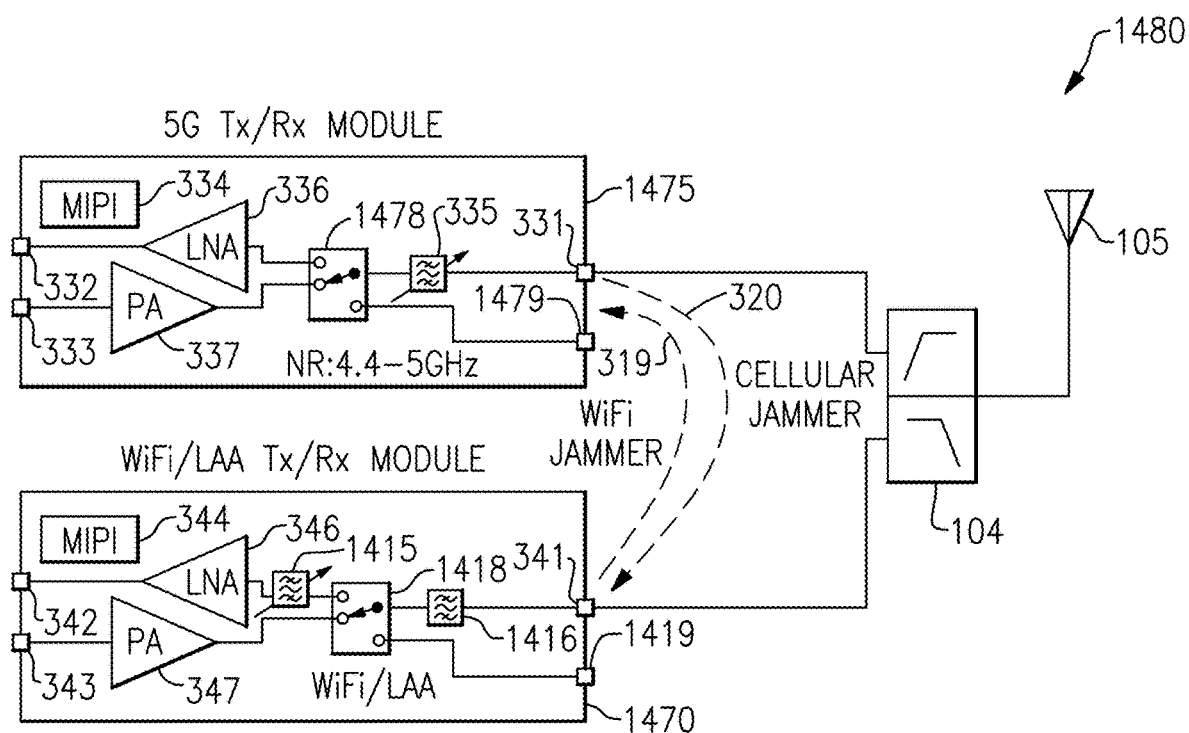
FIG. 7J is a schematic diagram of another embodiment of a front end circuit.

FIG. 7J is a schematic diagram of another embodiment of a front end circuit 1480. The front end circuit 1480 includes a 5G transmit/receive module 1475, a WiFi/LAA transmit/receive module 1470, a diplexer 104, and an antenna 105.

The front end circuit 1480 of FIG. 7J is similar to the front end circuit 1440 of FIG. 7H, except that the front end circuit 1480 includes an implementation of switches with an additional throw for connecting to bypass terminals. For example, in comparison to the WiFi/LAA transmit/receive module 1430 of FIG. 7H, the WiFi/LAA transmit/receive module 1470 of FIG. 7J includes a bypass terminal 1419 and a switch 1418 having a third throw coupled to the bypass terminal 1419. Additionally, in comparison to the 5G transmit/receive module 303 of FIG. 7H, the 5G transmit/receive module 1475 of FIG. 7J includes a bypass terminal 1479 and a switch 1478 having an additional throw coupled to the bypass terminal 1479.

Figure 8A:
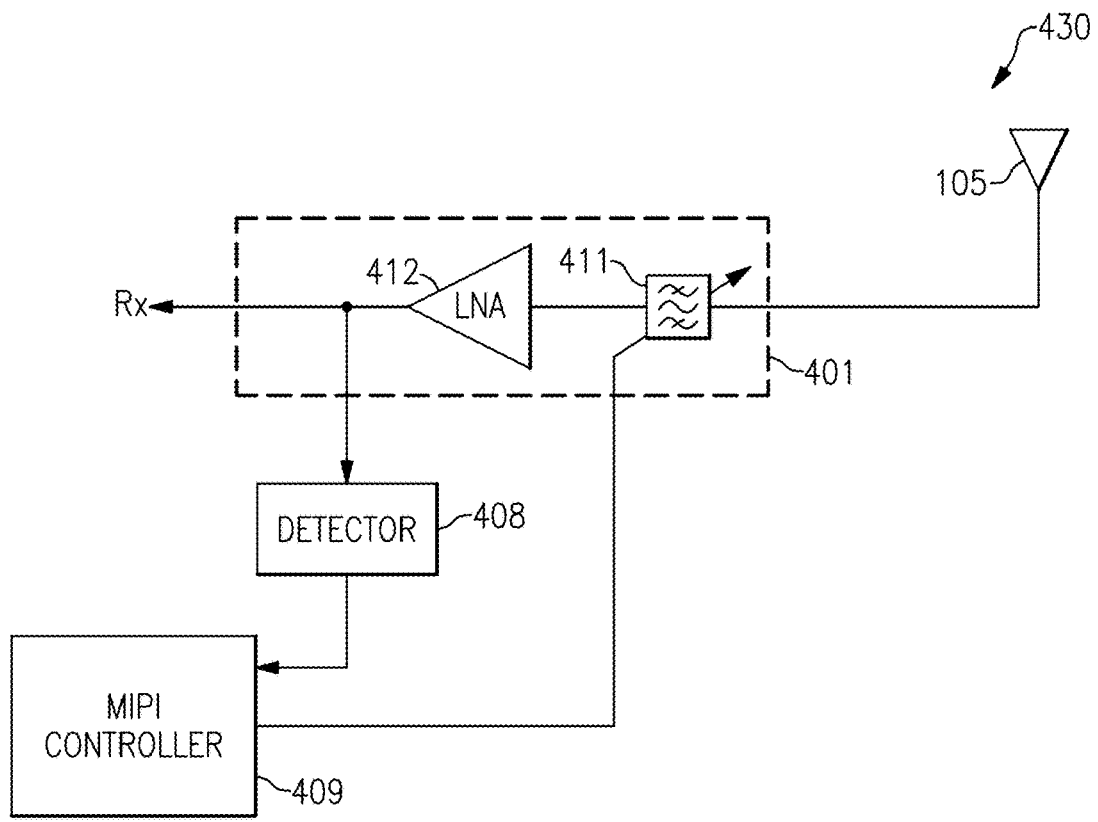
FIG. 8A is a schematic diagram of another embodiment of a front end circuit.

FIG. 8A is a schematic diagram of another embodiment of a front end circuit 430. The front end circuit 430 includes an antenna 105, an RF processing circuit 401, a blocker detector 408, and a serial interface controller 409 (a MIPI controller, in this example).

As shown in FIG. 8A, the RF processing circuit 401 includes a tunable filter 411 and an LNA 412 in cascade, in this embodiment. Additionally, the RF processing circuit 401 processes an RF signal received from the antenna 105 to generate an RF receive signal (RX). Although one embodiment of an RF processing circuit is depicted, the front end circuit 430 can be modified to include any of the RF processing circuits herein.

In the illustrated embodiment, the tunable filter 411 of the RF processing circuit 401 is controlled based on an amount of blocker that is sensed or detected by the blocker detector 408. The blocker detector 408 is positioned along an RF signal path through the RF processing circuit 401, in this embodiment.

Figure 8B:
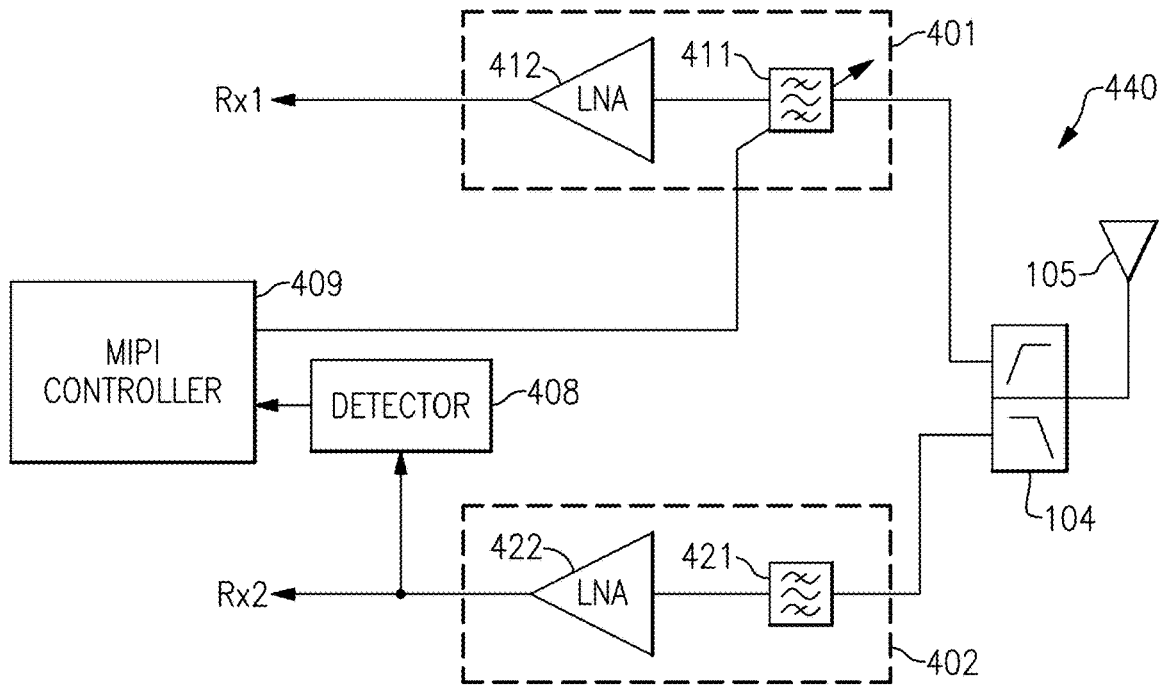
FIG. 8B is a schematic diagram of another embodiment of a front end circuit.

FIG. 8B is a schematic diagram of another embodiment of a front end circuit 440. The front end circuit 440 includes a first RF processing circuit 401, a second RF processing circuit 402, a diplexer 104, an antenna 105, a blocker detector 408, and a serial interface controller 409.

As shown in FIG. 8B, the first RF processing circuit 401 includes a tunable filter 411 and an LNA 412 in cascade. Additionally, the first RF processing circuit 401 generates a first RF receive signal (RX1) based on processing a first RF signal received from a first signal port of the diplexer 104. The second RF processing circuit 402 includes a bandpass filter 421 and an LNA 422 in cascade. Additionally, the second RF processing circuit 402 generates a second RF receive signal (RX2) based on processing a second RF signal received from a second signal port of the diplexer 104. Although specific embodiments of RF processing circuits are depicted, the front end circuit 440 can be modified to include any of the RF processing circuits herein.

In the illustrated embodiment, the blocker detector 408 senses a blocker signal level along an RF signal path through the second RF processing circuit 402, and the detected blocker level is used to control the tunable filter 411 in the first RF processing circuit 401.

Figure 8C:
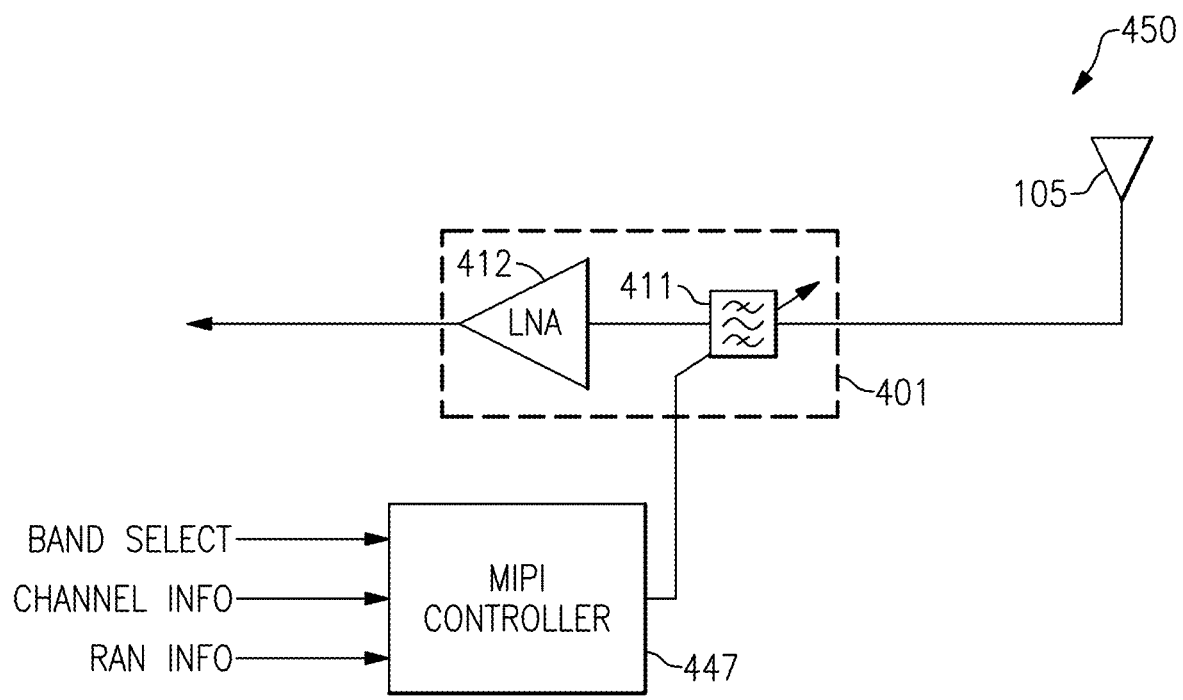
FIG. 8C is a schematic diagram of another embodiment of a front end circuit.

FIG. 8C is a schematic diagram of another embodiment of a front end circuit 450. The front end circuit 450 includes an antenna 105, an RF processing circuit 401, and a serial interface controller 447 (a MIPI controller, in this example). Although one embodiment of an RF processing circuit is depicted, the front end circuit 450 can be modified to include any of the RF processing circuits herein.

As shown in FIG. 8C, the serial interface controller 447 controls the tunable filter 411 of the RF processing circuit 401 based on system level information, such as band information (BAND SELECT), channel information (CHANNEL INFO), and/or radio access network information (RAN INFO).

Figure 9:
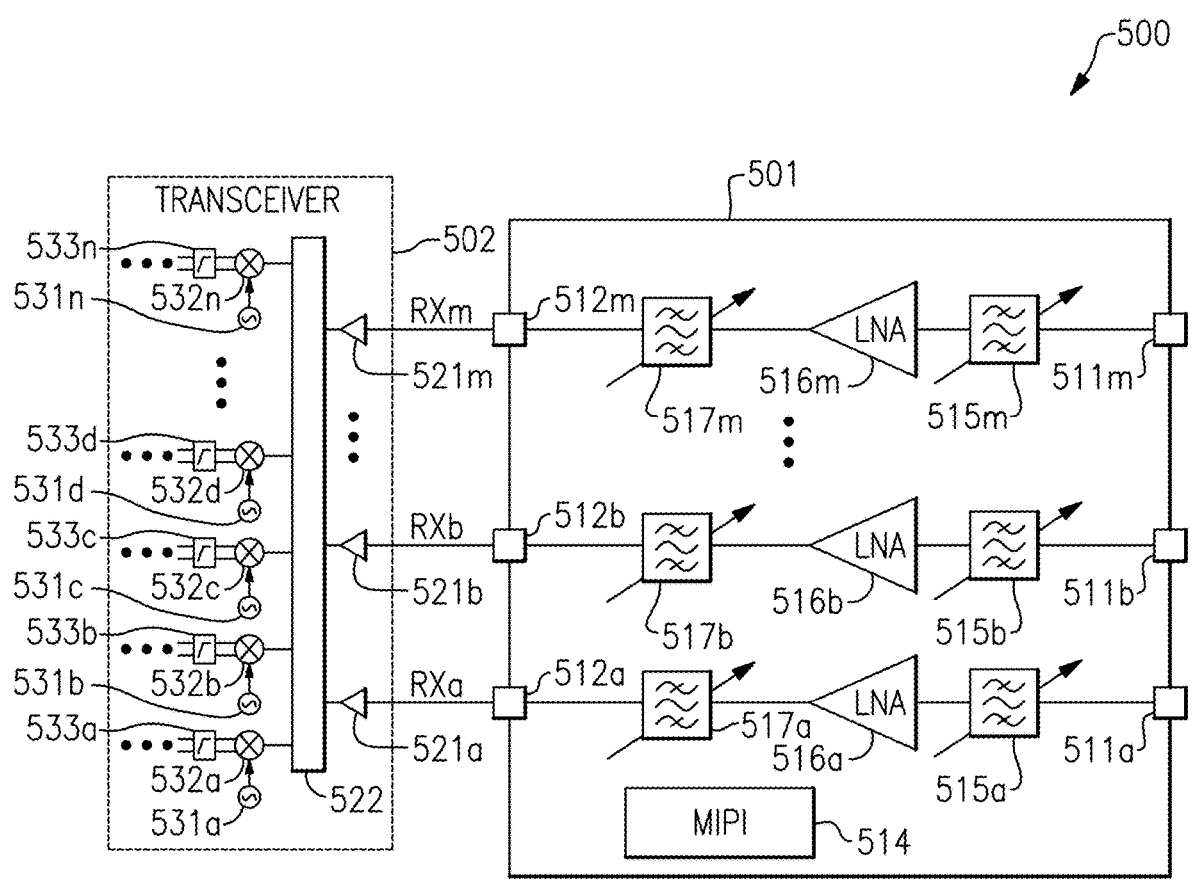
FIG. 9 is a schematic diagram of another embodiment of an RF system.

FIG. 9 is a schematic diagram of another embodiment of an RF system 500. The RF system 500 includes a front end circuit 501 and a transceiver 502.

In the illustrated embodiment, the front end circuit 501 includes RF signal input terminals 511a, 511b, ... 511m, RF signal output terminals 512a, 512b, ... 512m, tunable input filters 515a, 515b, ... 515m, LNAs 516a, 516b, ... 516m, tunable output filters 517a, 517b, ... 517m. As shown in FIG. 9, the front end circuit 501 outputs RF receive signals RXa, RXb, ... RXm on the RF signal output terminals 512a, 512b, ... 512m, respectively.

The front end circuit 501 includes m signal paths, where m is an integer greater than or equal to one. Additionally, each RF signal path includes a cascade of a first tunable filter, an LNA, and a second tunable filter, in this embodiment. Including an additional tunable filter along a signal path between an output of an LNA and an input to a transceiver aids in protecting the transceiver from desense.

Although one example of RF signal paths through a front end circuit is shown, a front end circuit can include RF signal paths implemented with other configurations of circuitry. Additionally, in implementations in which a front end circuit includes two or more RF signal paths, the implementation of each RF signal path need not be the same. Rather, each RF signal path can include circuitry desirable for a particular implementation or application.

In certain implementations, the front end circuit 501 corresponds to a semiconductor die, and the RF signal input terminals 511a, 511b, . . . 511m and the RF signal output terminals 512a, 512b, . . . 512m correspond to pins of the die. A pin of a semiconductor die is also referred to herein as a pad.

In the illustrated embodiment, the transceiver 502 includes amplifiers 521a, 521b, . . . 521m for amplifying the RF receive signals RXa, RXb, . . . RXm, respectively, from the front end circuit 501. Additionally, the transceiver 502 includes a multiplexing circuit 522, local oscillators (LOs) 531a, 531b, 531c, 531d, . . . 531n, downconverting mixers 532a, 532b, 532c, 532d, . . . 532n, and filters 533a, 533b, 533c, 533d, . . . 533n.

The multiplexing circuit 522 operates to select, combine, split, filter and/or otherwise process the amplified RF receive signals RXa, RXb, . . . RXm to generate input signals to the downconverting mixers 532a, 532b, 532c, 532d, . . . 532n. As shown in FIG. 9, the multiplexing circuit 522 receives m signals and outputs n signals, where m and n are each integers greater than equal to one. The integers m and n need not be the same, but rather m can be greater than n or m can be less than n.

Although certain embodiments have been illustrated and described in the context of specific frequency bands and communication standards, skilled artisans will appreciate that the teachings herein are applicable to a variety of bands and communication standards.

In a first example, n79 serves as a blocker to B42. For instance, B42 (about 3.4-3.6 GHz) can operate using a same path as n77 (about 3.3-4.2 GHz), and n79 (about 4.4-5 GHz) can serve as a blocker or jammer to receiving B42. For instance, distance between bands with no tuning is about 200 MHz, while distance between bands with tuning is about 800 MHz.

In a second example, 5 GHz WiFi serves as a blocker to n79. For instance, 5 GHz WiFi (about 5.18-5.95 GHz) can serve as a blocker or jammer to receiving n79 (about 4.4-5 GHz). For instance, distance between bands with no tuning is about 180 MHz, while distance between bands with tuning is a function of WiFi/cellular channel.

In a third example, 2.4 GHz WiFi serves as a blocker to B40. For instance, 2.4 GHz WiFi (about 2.4-2.482 GHz) can serve as a blocker or jammer to receiving B40 (about 2.3-2.4 GHz). The distance between bands with no tuning is about 0 MHz, while the distance between bands with tuning is a function of WiFi/cellular channel.

In a fourth example, 2.4 GHz WiFi (about 2.4-2.482 GHz) serves as a blocker or jammer to receiving B41 (about 2.496-2.690 GHz). The distance between bands with no tuning is about 14 MHz, while the distance between bands with tuning is a function of WiFi/cellular channel.

In a fifth example, 2.4 GHz WiFi (about 2.4-2.482 GHz) serves as a blocker or jammer to B7 Tx (about 2.500-2.570 GHz). The distance between bands with no tuning is about 18 MHz, while the distance between bands with tuning is a function of WiFi/cellular channel.

In a sixth example, B11/21 Tx (about 1.427-1.463 GHz) serves as a blocker or jammer to B32+B11/21Rx (about 1.452-1.511 GHz, with B32 in a range of 1.452-1.496 GHz and B11/21 in a range of about 1.476-1.511 GHz). The distance between bands with no tuning is about −11 MHz, while the distance between bands with tuning is about 13 MHz.

Although six examples have been provided above, the teachings herein are applicable to a variety of configurations, including, but not limited to, any scenario where frequency bands share a common RF signal path and have different coexistence conditions.

Figure 10:
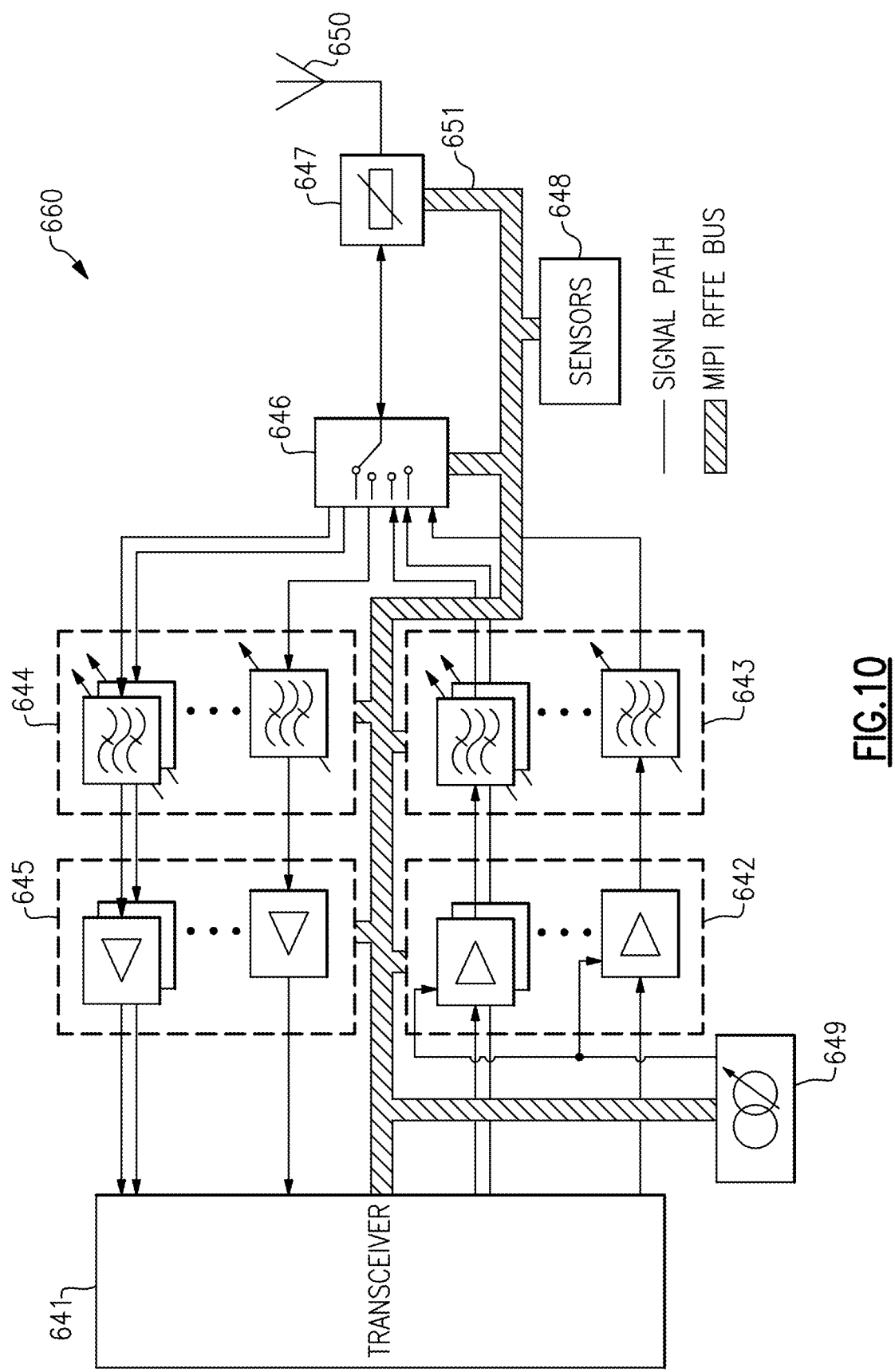
FIG. 10 is a schematic diagram of another embodiment of an RF system.

FIG. 10 is a schematic diagram of another embodiment of an RF system 660. The RF system 660 further includes a transceiver 641, power amplifier circuitry 642, transmit filter circuitry 643, receive filter circuitry 644, LNA circuitry 645, antenna switch circuitry 646, coupler circuitry 647, sensor circuitry 648, power management circuitry 649, an antenna 650, and a MIPI RFFE bus 651.

As shown in FIG. 10, various components of the RF system 660 are interconnected by the MIPI RFFE bus 651. Additionally, the transceiver 641 includes a master device of the MIPI RFFE bus 651, and each of the RF components includes a slave device of the MIPI RFFE bus 651. The master device of the transceiver 641 sends control commands over the MIPI RFFE bus 651 to configure the RF system 660 during initialization and/or while operational.

The power amplifier circuitry 642 can include one or more power amplifiers. As shown in FIG. 10, the power amplifier circuitry 642 receives one or more power amplifier supply voltages from the power management circuitry 649.

In certain implementations, the receive filter circuitry 644 includes one or more tunable filters implemented in accordance with the teachings herein. Additionally, the tunable filters are controlled by data receiver over the MIPI RFFE bus 651. Furthermore, in certain implementations, the transmit filter circuitry 643 includes one or more tunable filters implemented in accordance with the teachings herein.

Although FIG. 10 illustrates one example of an RF system, the teachings herein are applicable to RF systems implemented in a wide variety of ways.

Figure 11:
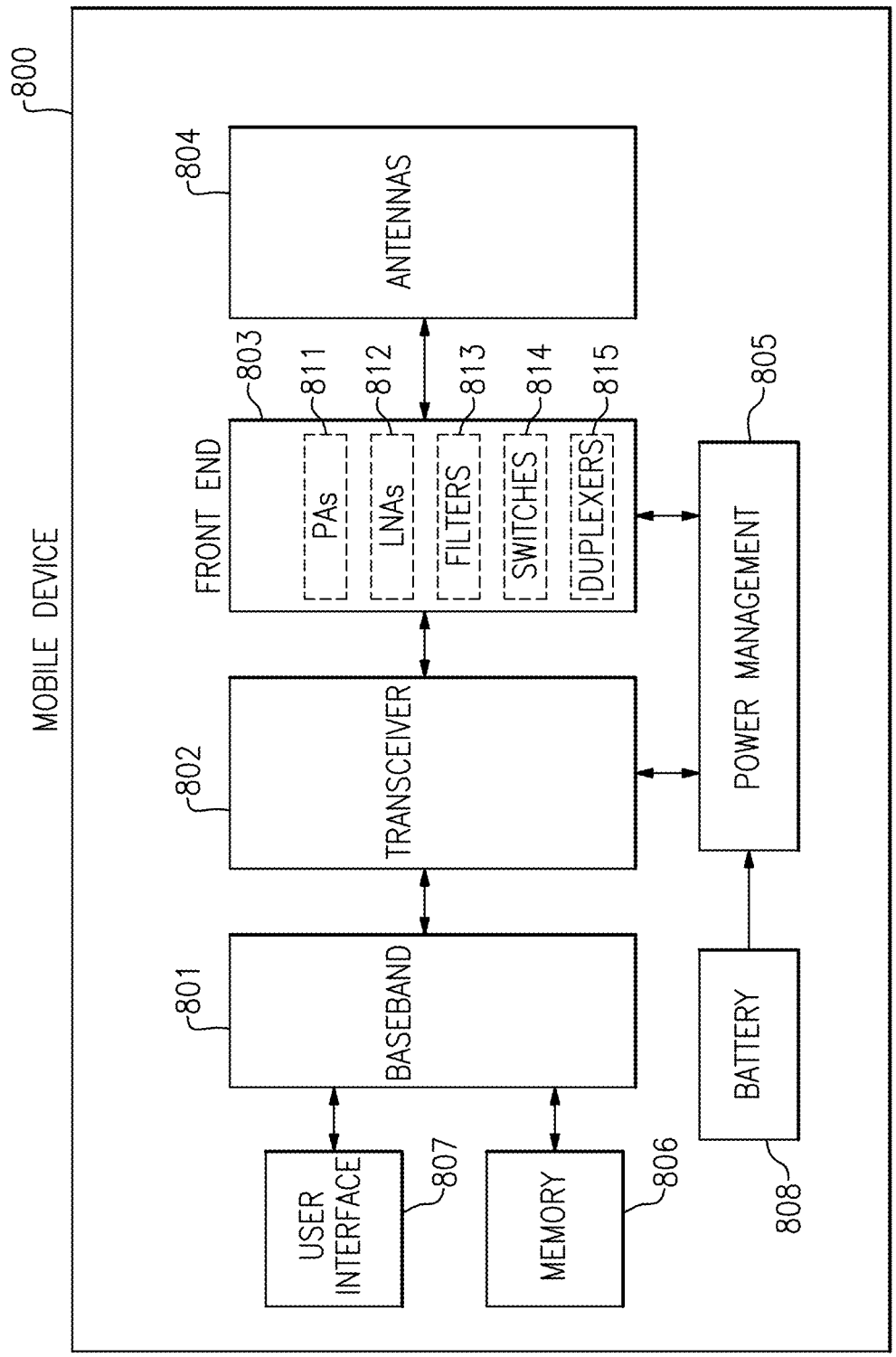
FIG. 11 is a schematic diagram of one embodiment of a mobile device.

FIG. 11 is a schematic diagram of one embodiment of a mobile device 800. The mobile device 800 includes a baseband system 801, a transceiver 802, a front end circuit 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front end circuit 803 aids is conditioning signals transmitted to and/or received from the antennas 804. In the illustrated embodiment, the front end circuit 803 includes power amplifiers (PAs) 811, low noise amplifiers (LNAs)

812, filters 813, switches 814, and duplexers 815. However, other implementations are possible.

For example, the front end circuit 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The front end circuit 803 can be implemented to include one or more radio frequency processing circuits with tunable filters in accordance with the teachings herein.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end circuit 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 11, the power management system 805 receives a battery voltage from the battery 808. The battery 808 can be any suitable battery for use in the mobile device 800, including, for example, a lithium-ion battery.

Figure 12A:
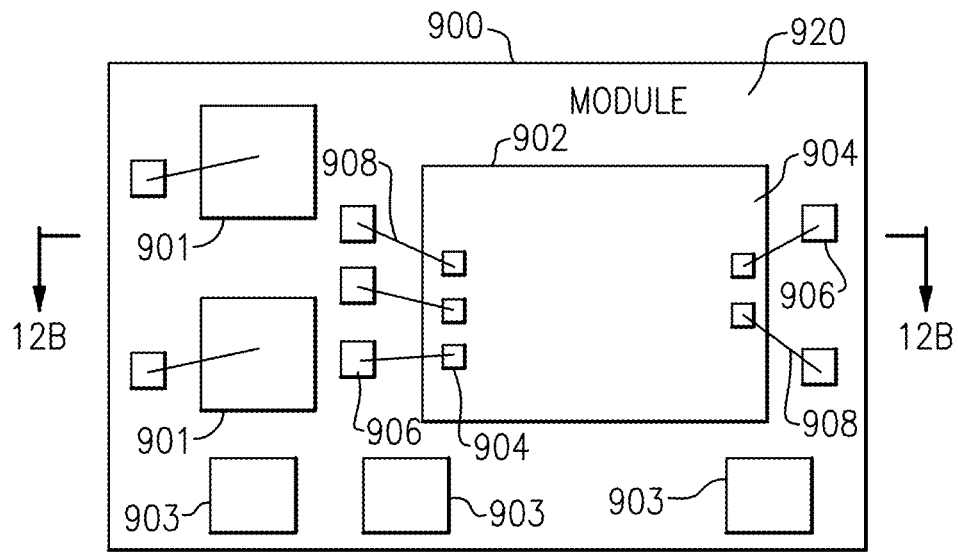
FIG. 12A is a schematic diagram of one embodiment of a packaged module.
Figure 12B:
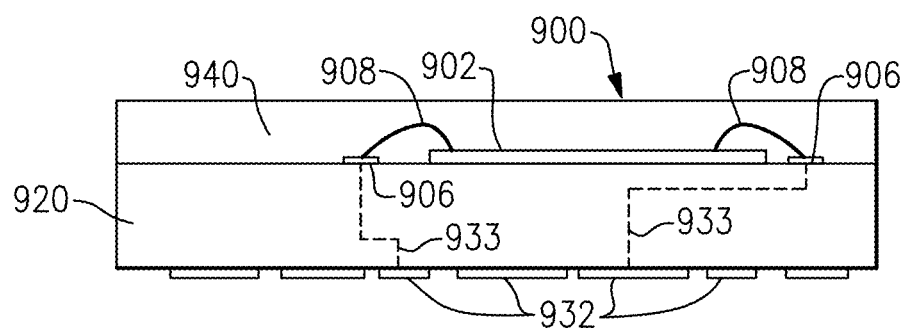
FIG. 12B is a schematic diagram of a cross-section of the packaged module of FIG. 12A taken along the lines 12B-12B.

FIG. 12A is a schematic diagram of one embodiment of a packaged module 900. FIG. 12B is a schematic diagram of a cross-section of the packaged module 900 of FIG. 12A taken along the lines 12B-12B.

The packaged module 900 includes radio frequency components 901, a semiconductor die 902, surface mount devices 903, wirebonds 908, a package substrate 920, and encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The packaged module 900 can be implemented to include one or more radio frequency processing circuits with tunable filters in accordance with the teachings herein. The radio frequency processing circuit can be implemented on the package substrate 920, including using components of the die 902 and/or other components attached to the package substrate 920. In certain implementations, the packaged module 900 corresponds to a front end module (FEM).

Although the packaged module 900 illustrates one example of a module implemented in accordance with the teachings herein, other implementations are possible.

As shown in FIG. 12B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a wireless device. The example contact pads 932 can be configured to provide radio frequency signals, bias signals, and/or power (for example, a power supply voltage and ground) to the semiconductor die 902. As shown in FIG. 12B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a first antenna; and
a front end circuit electrically coupled to the first antenna and including a first radio frequency processing circuit implemented to support reception of a first frequency band of a first communication standard and a second frequency band of a second communication standard, the first radio frequency processing circuit including a tunable filter having adjustable bandwidth to control an amount of filtering provided to a blocker signal of a third frequency band, the tunable filter operates with a first bandwidth in a first mode and with a second bandwidth in a second mode, the first mode providing a higher amount of filtering to the blocker signal than the second mode, the tunable filter further includes a notch filter component that is activated in the first mode and deactivated in the second mode, the front end circuit further including a second radio frequency processing circuit configured to generate a transmit signal in the third frequency band.

2. The mobile device of claim 1 further comprising a second antenna configured to receive the transmit signal from the second radio frequency processing circuit, the blocker signal arising from antenna-to-antenna coupling between the first antenna and the second antenna.

3. The mobile device of claim 1 wherein the front end circuit further includes a diplexer configured to couple the first radio frequency processing circuit and the second radio frequency processing circuit to the first antenna, the blocker signal arising from a finite isolation of the diplexer.

4. The mobile device of claim 1 wherein the first bandwidth is narrower than the second bandwidth.

5. The mobile device of claim 1 wherein the tunable filter has higher insertion loss in the first mode relative to the second mode.

6. The mobile device of claim 1 wherein selection between the first mode and the second mode is controlled based on data received over a serial interface.

7. The mobile device of claim 1 wherein the third frequency band is of the second communication standard.

8. The mobile device of claim 1 wherein the first communication standard is long term evolution (LTE) and the second communication standard is fifth generation (5G).

9. The mobile device of claim 1 wherein the first frequency band is LTE B42, the second frequency band is 5G n77, and the third frequency band is 5G n79.

10. A mobile device comprising:
a first antenna; and
a front end circuit electrically coupled to the first antenna and including a first radio frequency processing circuit implemented to support reception of a first frequency band of a first communication standard and a second frequency band of a second communication standard, the first radio frequency processing circuit including a tunable filter having adjustable bandwidth to control an amount of filtering provided to a blocker signal of a third frequency band, the tunable filter operates with a first bandwidth in a first mode and with a second bandwidth in a second mode, the first mode providing a higher amount of filtering to the blocker signal than the second mode, the front end circuit further including a second radio frequency processing circuit configured to generate a transmit signal in the third frequency band, the front end circuit further includes a blocker detector configured to generate a detection signal based on detecting for the blocker signal, selection between the first mode and the second mode controlled based on the detection signal.

11. The mobile device of claim 10 wherein the blocker detector is implemented along a radio frequency signal path through the first radio frequency processing circuit.

12. The mobile device of claim 10 wherein the blocker detector is implemented along a radio frequency signal path through the second radio frequency processing circuit.

13. A mobile device comprising:
a first antenna; and
a front end circuit electrically coupled to the first antenna and including a first radio frequency processing circuit implemented to support reception of a first frequency band of a first communication standard and a second frequency band of a second communication standard, the first radio frequency processing circuit including a tunable filter having adjustable bandwidth to control an amount of filtering provided to a blocker signal of a third frequency band, the tunable filter operates with a first bandwidth in a first mode and with a second bandwidth in a second mode, the first mode providing a higher amount of filtering to the blocker signal than the second mode, the front end circuit further including a second radio frequency processing circuit configured to generate a transmit signal in the third frequency band, and selection between the first mode and the second mode is controlled based on whether the second radio frequency processing circuit is transmitting the transmit signal.

14. A front end system comprising:
a first radio frequency processing circuit implemented to support reception of a first frequency band of a first communication standard and a second frequency band of a second communication standard, the first radio frequency processing circuit including a tunable filter having adjustable bandwidth to control an amount of filtering provided to a blocker signal of a third frequency band, the tunable filter operates with a first bandwidth in a first mode and with a second bandwidth in a second mode, the first mode providing a higher amount of filtering to the blocker signal than the second mode, the tunable filter further includes a notch filter component that is activated in the first mode and deactivated in the second mode; and
a second radio frequency processing circuit configured to generate a transmit signal in the third frequency band.

15. The front end system of claim 14 wherein the first bandwidth is narrower than the second bandwidth.

16. The front end system of claim 14 wherein the tunable filter has higher insertion loss in the first mode relative to the second mode.

17. A method of radio frequency communication, the method comprising:
receiving a first signal and a second signal via an antenna, the first signal of a first frequency band of a first communication standard and the second signal of a second frequency band of a second communication standard;
processing the first signal and the second signal using a first radio frequency processing circuit;
transmitting a transmit signal in a third frequency band using a second radio frequency processing circuit; and
controlling an amount of filtering provided to a blocker signal of the third frequency band by adjusting a bandwidth of a tunable filter of the first radio frequency processing circuit, the tunable filter operates with a first bandwidth in a first mode and with a second bandwidth in a second mode, the first mode providing a higher amount of filtering to the blocker signal than the second mode, the tunable filter further includes a notch filter component that is activated in the first mode and deactivated in the second mode.

18. The method of claim 17 wherein the first bandwidth is narrower than the second bandwidth.

19. The method of claim 17 wherein the tunable filter has higher insertion loss in the first mode relative to the second mode.

20. The method of claim 17 wherein selection between the first mode and the second mode is controlled based on data received over a serial interface.

* * * * *